(12) United States Patent
Cho et al.

(10) Patent No.: US 9,223,214 B2
(45) Date of Patent: *Dec. 29, 2015

(54) SELF-ASSEMBLED STRUCTURES, METHOD OF MANUFACTURE THEREOF AND ARTICLES COMPRISING THE SAME

(71) Applicants: Rohm and Haas Electronic Materials LLC, Marlborough, MA (US); The Texas A&M University System, College Station, TX (US)

(72) Inventors: Sangho Cho, Bryan, TX (US); Guorong Sun, Bryan, TX (US); Karen L. Wooley, College Station, TX (US); James W. Thackeray, Braintree, MA (US); Peter Trefonas, III, Medway, MA (US)

(73) Assignees: THE TEXAS A&M UNIVERSITY SYSTEM, College Station, TX (US); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 165 days.

This patent is subject to a terminal disclaimer.

(21) Appl. No.: 13/681,026

(22) Filed: Nov. 19, 2012

(65) Prior Publication Data

US 2014/0141375 A1 May 22, 2014

(51) Int. Cl.
*G03F 7/038* (2006.01)
*G03F 7/075* (2006.01)
*G03F 7/16* (2006.01)
*G03F 7/30* (2006.01)
*G03F 7/004* (2006.01)

(52) U.S. Cl.
CPC ............ *G03F 7/0382* (2013.01); *G03F 7/0042* (2013.01); *G03F 7/0045* (2013.01); *G03F 7/0046* (2013.01); *G03F 7/0048* (2013.01); *G03F 7/038* (2013.01); *G03F 7/0387* (2013.01); *G03F 7/075* (2013.01); *G03F 7/0757* (2013.01); *G03F 7/168* (2013.01)

(58) Field of Classification Search
None
See application file for complete search history.

(56) References Cited

U.S. PATENT DOCUMENTS 5,750,587 A 5/1998 Manzouji et al.
6,166,101 A 12/2000 Takami (Continued)

FOREIGN PATENT DOCUMENTS

KR 20030028987 A 4/2003
TW I271411 B 1/2007
WO WO2006129800 A1 12/2006

OTHER PUBLICATIONS

Sutthasupa, Sutthira, et al; "Recent advances in ring-opening metathesis polymerization, and application to synthesis of functional materials"; Polymer Journal Sep. 6, 2010 42, p. 905-915; The Socity of Polymer Science, Japan.

(Continued)

*Primary Examiner* — Cynthia Hamilton
(74) *Attorney, Agent, or Firm* — Cantor Colburn LLP

(57) ABSTRACT

Disclosed herein is a composition comprising a graft block copolymer comprising a copolymer comprising a backbone polymer; and a first graft polymer that comprises a surface energy reducing moiety; the first graft polymer being grafted onto the backbone polymer; where the surface energy reducing moiety comprises a fluorine atom, a silicon atom, or a combination of a fluorine atom and a silicon atom; a photoacid generator; and a crosslinking agent.

11 Claims, 4 Drawing Sheets

A
(top view)

B
(side view)

(56) References Cited

U.S. PATENT DOCUMENTS

| | | | |
|---|---|---|---|
| 6,392,008 | B1 | 5/2002 | Allcock |
| 7,261,993 | B2 | 8/2007 | Schadt, III et al. |
| 7,662,996 | B2 | 2/2010 | Bell |
| 8,765,894 | B2 | 7/2014 | Bell |
| 8,822,130 | B2 * | 9/2014 | Cho et al. .......... 430/270.1 |
| 2002/0058198 | A1 | 5/2002 | Klauck-Jacobs |
| 2004/0248039 | A1 | 12/2004 | Sounik |
| 2005/0182220 | A1 | 8/2005 | Liaw |
| 2007/0037940 | A1 | 2/2007 | Lazzari |
| 2008/0194450 | A1 | 8/2008 | Yamamoto et al. |
| 2010/0022741 | A1 | 1/2010 | Cheng |
| 2010/0099906 | A1 | 4/2010 | Bell |
| 2010/0304290 | A1 | 12/2010 | Wang |
| 2011/0143260 | A1 | 6/2011 | Bell |
| 2013/0072650 | A1 | 3/2013 | Tew |
| 2013/0296491 | A1 | 11/2013 | Xia |
| 2013/0298590 | A1 | 11/2013 | Heinzl |
| 2013/0324666 | A1 | 12/2013 | Xia |
| 2014/0011958 | A1 | 1/2014 | Miyake |
| 2014/0030652 | A1 | 1/2014 | Senzaki |
| 2014/0142249 | A1 | 5/2014 | Cho |
| 2014/0142252 | A1 | 5/2014 | Cho |
| 2015/0072291 | A1 | 3/2015 | Cho |
| 2015/0072292 | A1 | 3/2015 | Cho |

OTHER PUBLICATIONS

Leitgeb, Anita, et al; "The ROMP toolbox upgraded"; Institute for Chemistry and Technology of Materials (ICTM), Graz University of Technology, Stremayrgasse 16, A-8010 Graz, Australia; Polymer/Elsevier Jornal 51 (2010) p. 2927-2946.

Nomura, Kotohiro, et al; "Precise synthesis of polymers containing functional end groups by living ring-opening metathesis polymerization (ROMP): Efficient tools for synthesis of block/gaft copolymers"; Graduate School of Materials Science, Nara Institute of Science Technology (NAIST), 8916-5 Takayama, Ikoma, Nara 630-0101; Japan; Polymer/Elsevier jornal, Year 2010 Journal is Polymer vol. 51 pp. 1861-1881.

Bolton, Justin, et al.; "Large Pore Size Nanporous Materials fromthe Self-Assembly of Asymmetric Bottlebrush Block Copoloymers"; Department of Chemistry, University at Buffalo; ACS Publications; NANO Letter, 2011, American Chemical Society; 11, 998-1001, Aug. 17, 2015.

Hosono, Nobuhiko, et al; "Large-area Three-Dimesional Molecular Ordering of a Polymer Brush by One-Step processing"; Science Magazine, Nov. 5, 2012; vol. 330; p. 808-811.

Sheiko, Sergei, et al; "Cylindrical Molecular Brushes: Synthesis, characterization, and properties"; Prosgress in Polymer Science, Elsevier Journal vol. 33, May 8, 2008; p. 759-785.

Lee, Hyung-il, et al; "Stimuli-responsive molecular brushes"; Progress in Polymer Science/Elsevier Journal; vol. 35; Oct. 30, 2009; p. 24-44.

Zhang, Mingfu; "Cylindrical Polymer Brushes"; Polymer Science and Engineering, University of Massachusetts, Amherst, Massachusetts; Journal of Polymer Science; Apr. 15, 2005; p. 3461-3481.

Amir, R. J. et al. "Enzymatically Triggered Self-Assembly of Block Copolymers" J. Am. Chem. Soc. 2009, 131, 13949-13951.

Hosano et al. "Large Area Three-Dimensional Molecular Ordering of a Polymer Brush by One-Step Processing" Science 330, pp. 808-811 Publication Date Nov. 5, 2010.

Li, A. et al., "One-Pot, Facile Synthesis of Well-Defined Molecular Brush Copolymers by a Tandem RAFT and ROMP, •"Grafting-Through" Strategy" J. Polym. Sci., Part A: Polym. Chem. 2012, 50, 1681-1688.

Li, Z., et al. "Dynamic Cylindrical Assembly of Triblock Copolymers by a Hierarchical Process of Covalent and Supramolecular Interactions" J. Am. Chem. Soc. 2011, 133, 1228-1231.

Macromolecule (polymer molecule) PAC, 1996, 68, 2287 (Glossary of basic terms in polymer science (IUPAC Recommendations 1996)) on p. 2289.

Pitois, C. et al., "Functionalized Fluorinated Hyperbranched Polymers for OpticalWaveguide Applications" Adv. Mater. 2001, 13, No. 19, Oct. 2., 1483-1487.

Sun et al., "Nanoscopic Cylindrical Dual Concentric and Lengthwise Block Brush Terpolymers as Covalent Preassembled High-Resolution and High-Sensitivity Negative-Tone Photoresist Materials" Journal of the American Chemical Society, 2013, 135, pp. 4203-4206, published Mar. 12, 2013.

Cho, "Investigation of a fluorinated ESCAP based resist for 157 nm lithography" Advances in Resist Technology and Processing XIX; Proceedings of SPIE vol. 4690 (2002) pp. 522-532.

Li, et al. "Dynamic Cylindrical Assembly of Triblock Copolymers by a Hierarchaical Process of Covalent and Supramolecular Interations" J. Am. Chem. Soc. 2011, 133, 1228-1231.

Nomura et al. "Precise synthesis of polymers containing functional end groups by living ring-opening metathesis polymerization (ROMP): Efficient tools for synthesis of block/graft copolymers" vol. 51, Issue 9, Apr. 20, 2010, pp. 1861-1881.

Benjamin R. Sveinbjörnsson, et al., "Rapid self-assembly of brush block copolymers to photonic crystals" Proc. Natl. Acad. Sci. USA 2013 110 (49) 19707-19712.

Lanson, David et al. "Poly(styrene)comb-b-Poly(ethylene oxide)comb Copolymers: Synthesis and AFM Investigation of Intra- and Supramolecular Organization as Thin Deposits" Macromolecules, 2007, 40 (26), pp. 9503-9509.

Lanson, David et al. "Synthesis of (Poly(chloroethyl vinyl ether)-g-polystyrene)comb-b-(poly(chloropyran ethoxy vinyl ether)-g-polyisoprene)comb Copolymers and Study of Hyper-Branched Micelle Formation in Dilute Solutions" Macromolecules, 2007, 40, 5559-5565.

Lee, et al. "Hetero-Grafted Block Brushes with PCL and PBA Side Chains" Macromolecules 2008, 41, 6073-6080.

* cited by examiner

SELF-ASSEMBLED STRUCTURES, METHOD OF MANUFACTURE THEREOF AND ARTICLES COMPRISING THE SAME

BACKGROUND

This disclosure relates to self-assembled structures, methods of manufacture thereof and to articles comprising the same.

Block copolymers form self-assembled nanostructures in order to reduce the free energy of the system. Nanostructures are those having average largest widths or thicknesses of less than 100 nanometers (nm). This self-assembly produces periodic structures as a result of the reduction in free energy. The periodic structures can be in the form of domains, lamellae or cylinders. Because of these structures, thin films of block copolymers provide spatial chemical contrast at the nanometer-scale and, therefore, they have been used as an alternative low-cost nano-patterning material for generating nanoscale structures. While these block copolymer films can provide contrast at the nanometer scale, it is often difficult to produce copolymer films that can display periodicity at less than 60 nm. Modern electronic devices however often utilize structures that have a periodicity of less than 60 nm and it is therefore desirable to produce copolymers that can easily display structures that have average largest widths or thicknesses of less than 60 nm, while at the same time displaying a periodicity of less than 60 nm.

Many attempts have been made to develop copolymers that have average largest widths or thicknesses of less than 60 nm, while at the same time displaying a periodicity of less than 60 nm. The assembly of polymer chains into a regular array, and especially a periodic array, is sometimes referred to as "bottom up lithography". The processes for forming periodic structures for electronic devices from block copolymers within lithography are known as "directed self-assembly". However, four of the challenges and indeed greatest difficulties in trying to build a workable electronic device from a periodic array have to do with firstly the need to register or align that periodic array with great precision and accuracy to the underlying elements of the circuit pattern, and secondly the need to form non-periodic shapes in the pattern as part of the electronic circuit design, and thirdly the ability for the pattern to form sharp bends and corners and line ends as part of the circuit design pattern layout requirements, and fourthly the ability for the pattern to be formed in a multitude of periodicities. These limitations with bottom-up lithography using periodic patterns formed from block copolymers have resulted in the need to design complex chemoepitaxy or graphoepitaxy process schemes for alignment, pattern formation and defect reduction.

Conventional 'top down' lithography, which creates patterns through projection and focusing of light or energetic particles through a mask onto a thin photoresist layer on a substrate, or in the case of electron beam lithography may involve projection of electrons through an electromagnetic field in a patternwise manner onto a thin photoresist layer on a substrate, has the advantage of being more amenable to conventional methods of alignment of the pattern formation to the underlaying elements of the circuit pattern, and being able to form non-periodic shapes in the pattern as part of the circuit design, being able to directly form line ends and sharp bends, and the ability to form patterns in a multiplicity of periodicities. However, top down lithography, in the case of optical lithography, is constrained in the smallest pattern it can form, as a result of the diffraction of light through mask openings whose dimension is similar or smaller than the wavelength, which causes loss of light intensity modulation between the masked and unmasked regions. Other important factors which limit resolution are light flare, reflection issues from various film interfaces, imperfections in the optical quality of the lens elements, focal depth variations, photon and photoacid shot noise and line edge roughness. In the case of electron beam lithography, the smallest useful pattern sizes which can be formed are limited by the beam spot size, the ability to stitch or merge writing patterns effectively and accurately, electron scatter and backscatter in the photoresist and underlying substrates, electron and photoacid shot noise and line edge roughness. Electron beam lithography is also highly limited by throughput, since the images are patternwise formed pixel-by-pixel, because as smaller pixel dimensions are required for smaller pattern sizes, the number of imaging pixels per unit area increases as the square of the pixel unit dimension.

SUMMARY

Disclosed herein too is a composition comprising a graft block copolymer comprising a copolymer comprising a backbone polymer; and a first graft polymer that comprises a surface energy reducing moiety; the first graft polymer being grafted onto the backbone polymer; where the surface energy reducing moiety comprises a fluorine atom, a silicon atom, or a combination of a fluorine atom and a silicon atom; a photoacid generator; and a crosslinking agent.

Disclosed herein too is a method of manufacturing a photoresist comprising mixing a composition comprising a copolymer comprising a backbone polymer; and a first graft polymer that comprises a surface energy reducing moiety; the first graft polymer being grafted onto the backbone polymer; where the surface energy reducing moiety comprises a fluorine atom, a silicon atom, or a combination of a fluorine atom and a silicon atom; a photoacid generator; and a crosslinking agent; disposing the composition on a substrate; forming a film on the substrate; disposing a mask on the film; exposing the film to electromagnetic radiation to form a crosslinked film that comprises bottle-brushes; baking the film; and dissolving unreacted portions of the film.

BRIEF DESCRIPTION OF THE FIGURES

FIGS. 4A-4C depict AFM height images of patterns after post exposure baking-electron beam lithography (PEB-EBL) of a chemically amplified resist (CAR-I, CAR-II), and the brush control at 250 $\mu C/cm^2$ exposure dosage respectively while Figure (D-F) depict AFM height images of patterns after PEB-EBL of CAR-I, CAR-II, and the brush control at 400 $\mu C/cm^2$ exposure dosage, respectively. FIGS. 4G-4H depict AFM height images of patterns from "direct"-EBL of CAR-I at 400 $\mu C/cm^2$ (G) and 600 $\mu C/cm^2$ (H) exposure dosages respectively. Scale bar=500 nm.

DETAILED DESCRIPTION

Figure 1:
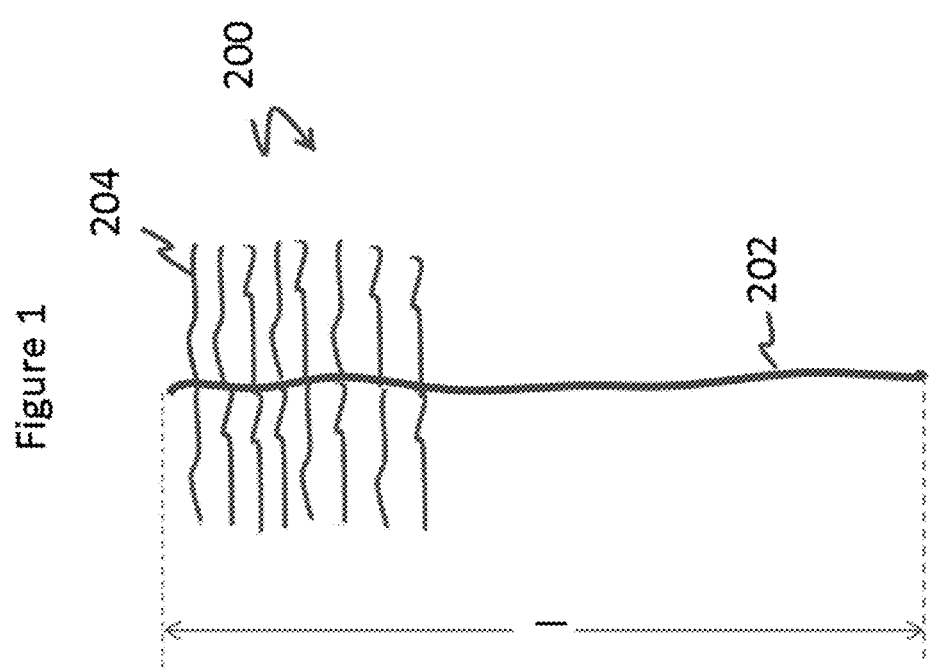
FIG. 1 is a schematic depiction of an exemplary brush polymer that is disposed upon a substrate.

As used herein, "phase-separate" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking" or "annealing", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 350° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprises a block copolymer having at least a first block and a second block that forms domains through phase separation that orient perpendicular to the substrate upon annealing. "Domain", as used herein, means a compact crystalline, semi-crystalline, or amorphous region formed by corresponding blocks of the block copolymer, where these regions may be lamellar or cylindrical and are formed orthogonal or perpendicular to the plane of the surface of the substrate and/or to the plane of a surface modification layer disposed on the substrate. In an embodiment, the domains may have an average largest dimension of 1 to 30 nanometers (nm), specifically 5 to 22 nm, and still more specifically 5 to 20 nm.

The term "$M_n$" used herein and in the appended claims in reference to a block copolymer of the present invention is the number average molecular weight of the block copolymer (in g/mol) determined according to the method used herein in the Examples. The term "$M_w$" used herein and in the appended claims in reference to a block copolymer of the present invention is the weight average molecular weight of the block copolymer (in g/mol) determined according to the method used herein in the Examples.

The term "PDI" or "Đ" used herein and in the appended claims in reference to a block copolymer of the present invention is the polydispersity (also called polydispersity index or simply "dispersity") of the block copolymer determined according to the following equation:

$$PDI = \frac{M_w}{M_n}.$$

The transition term "comprising" is inclusive of the transition terms "consisting of" and "consisting essentially of". The term "and/or" is used herein to mean both "and" as well as "or". For example, "A and/or B" is construed to mean A, B or A and B.

Disclosed herein is a graft block copolymer that comprises a polymer as its backbone (hereinafter the backbone polymer) with a first polymer that is grafted onto the backbone polymer. The first polymer comprises a surface energy reducing moiety that comprises either fluorine, silicon or a combination of fluorine and silicon. The second polymer also comprises a functional group that is used to crosslink the graft block copolymer after it is disposed upon a substrate. Each of the backbone and the graft polymers can be a homopolymer or a copolymer. The graft block copolymer can self-assemble in the form of a plurality of bottle-brushes when disposed upon a substrate. The graft block copolymer can then be crosslinked to form a film. Upon crosslinking, the film comprises crosslinked bottle-brushes. The polymer backbone is topologically similar to the handle of a bottle-brush, while the polymer grafts emanate radially outwards from the graft block copolymer backbone to form a structure that is similar to the bristles of the bottle-brush, hence the use of the term "bottle-brush".

Disclosed herein too is a graft block copolymer that comprises a plurality of block copolymers each of which comprise the backbone polymer and where the first polymer and a second polymer are grafted onto the backbone. The backbone polymer may be a homopolymer or a block copolymer. The first polymer and the second polymer can be homopolymers or copolymers. In an exemplary embodiment, the first polymer is a homopolymer that comprises a surface energy reducing moiety, while the second polymer is a copolymer that has a functional group through which the graft block copolymer is crosslinked.

When the graft block copolymer is disposed upon a substrate it forms a film that comprises bottle-brush polymers that are then crosslinked together by reacting the functional groups.

In one embodiment, the graft block copolymer comprises a first block polymer and a second block polymer. The first block polymer thus comprises the backbone polymer with the first polymer (a homopolymer) grafted onto the backbone polymer. The first polymer is also referred to herein as the first graft polymer. The second block polymer comprises the backbone polymer with the second polymer (a copolymer) grafted onto the backbone polymer. The second polymer is also referred to herein as the second graft polymer. The first graft polymer and the second graft polymer are also referred to as flexible polymers. The first block polymer is therefore a copolymer while the second block polymer is a terpolymer. The first polymer and/or the second polymer comprises a functional group that is used to crosslink the graft block copolymer. In one embodiment, the graft block copolymer is crosslinked after it is disposed upon a substrate.

The first polymer comprises the surface energy reducing moiety that drives higher degrees of self-assembly when the graft block copolymer is disposed upon a substrate. The presence of the surface energy reducing moiety results in domain sizes and inter domain periodic spacing that are less than 30 nanometers, preferably less than 20 nanometers, and more preferably less than 15 nanometers, when the copolymer is disposed upon a substrate. These narrow domain sizes and narrow interdomain spacings are very useful for lithography. They can be used to produce semiconductors and other electronic components. In one embodiment, the graft block copolymer can be crosslinked and then used as a negative tone photoresist. In another embodiment, the graft block copolymer is not crosslinked and is used as a positive tone photoresist.

Disclosed herein too is a method of manufacturing the graft block copolymer. The method comprises producing a series of macromonomers (that form the backbone polymer) and then performing sequential grafting-through polymerizations to create the graft copolymer. Alternatively, grafting-onto or grafting-from techniques can be used for the graft copolymer syntheses.

Disclosed herein too is a photoresist composition that comprises the graft block copolymer, a photoacid generator and a crosslinker. The photoresist composition is manufactured by crosslinking the photoresist composition that comprises bottle-brush polymers that have both the surface energy reducing and reactive moieties. Disclosed herein too are articles that comprise the graft block copolymer. In one embodiment, the article comprises a photoresist.

FIG. 1 depicts a polymeric graft block copolymer 200 (having a bottle brush morphology) that comprises a polymer backbone 202 (hereinafter the "backbone polymer") of length "l" that is reacted to the graft polymer 204 (hereinafter the "first graft polymer)". The first graft polymer can be covalently reacted to the polymer backbone along a portion of the length of the backbone or along the entire length of the backbone. The first polymer can also be covalently bonded to the backbone polymer backbone 202 along the entire length of the backbone and could extend radially outward in any direction or combination of directions from the backbone or along a portion of the circumference of the backbone. In our nomenclature, bottle-brush polymers are different from polymer brushes in that in a polymer brush, the graft polymer is reacted to only one surface of a substrate, while in a bottle brush polymer, the graft polymer is grafted on all sides of the polymer backbone, thus producing a morphology that appears to be bottle-brush like in appearance. Polymer brushes are analogous in morphology to a field of grass, where the polymer is the grass and is disposed on a substrate (which is analogous to the soil in which the grass grows).

In one embodiment, the graft block copolymers 200 self-assemble (upon being disposed upon a surface) such that the resulting assembly displays order in at least one direction, specifically at least in two directions, and more specifically at least in three directions. In one embodiment, the graft block copolymer bottle-brushes self-assemble (upon being disposed upon a surface) such that the resulting assembly displays order in at least two mutually perpendicular directions, and more specifically in at least three mutually perpendicular directions. The term "order" refers to periodicity between repeating structures in the assembly when measured in a particular direction.

The backbone polymer is generally used to form the polymer backbone 202 of the graft block copolymer. It is desirable for the backbone polymer that forms the backbone to allow for sequential polymerization of macromonomers to manufacture the graft block copolymers. In one embodiment, the backbone polymer can be one that comprises a strained ring along the chain backbone. In another embodiment, the backbone polymer can be a polyacetal, a polyacrylic, a polycarbonate, a polystyrene, a polyester, a polyamide, a polyamideimide, a polyarylate, a polyarylsulfone, a polyethersulfone, a polyphenylene sulfide, a polyvinyl chloride, a polysulfone, a polyimide, a polyetherimide, a polytetrafluoroethylene, a polyetherketone, a polyether etherketone, a polyether ketone ketone, a polybenzoxazole, a polyoxadiazole, a polybenzothiazinophenothiazine, a polybenzothiazole, a polypyrazinoquinoxaline, a polypyromellitimide, a polyquinoxaline, a polybenzimidazole, a polyoxindole, a polyoxoisoindoline, a polydioxoisoindoline, a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, a polyanhydride, a polyvinyl ether, a polyvinyl thioether, a polyvinyl alcohol, a polyvinyl ketone, a polyvinyl halide, a polyvinyl nitrile, a polyvinyl ester, a polysulfonate, a polynorbornene, a polysulfide, a polythioester, a polysulfonamide, a polyurea, a polyphosphazene, a polysilazane, a polyurethane, or the like, or a combination including at least one of the foregoing polymers. In an exemplary embodiment, the backbone polymer is polynorbornene. The ring of the polynorbornene repeat units may, if desired, be substituted with an alkyl group, an araalkyl group, or an aryl group.

The number of repeat units in the backbone polymer (that forms the backbone of the copolymer) is about 3 to about 75, specifically about 10 to about 60, specifically about 25 to about 45. The number average molecular weight of the backbone is 200 to 10,000 grams per mole as measured by GPC. In a preferred embodiment, the number average molecular weight of the backbone is 3,050 to 5,500 grams per mole as measured by GPC.

The backbone polymer (that forms the polymer backbone) has grafted onto it the first polymer thereby forming a graft copolymer. In one embodiment, the backbone polymer has grafted onto it one or more different types of graft polymers. In another embodiment, the backbone polymer has grafted onto it two or more different types of graft polymers. The graft block copolymer can thus be a block copolymer, an alternating copolymer, an alternating block copolymer, a random copolymer, a random block copolymer, or a combination thereof.

In one embodiment, the graft block copolymer can comprise the backbone polymer with a first polymer that is grafted onto the backbone polymer. The first polymer is preferably a homopolymer and comprises the surface energy reducing moiety. The surface energy reducing moieties generally comprise silicon atoms, fluorine atoms, or a combination of fluorine atoms and silicon atoms. The surface energy reducing moiety facilitates a high degree of self-assembly when the graft block copolymer is disposed upon a substrate. The first polymer may be covalently or ionically bonded onto the backbone polymer. In an exemplary embodiment, the first polymer is covalently bonded onto the backbone polymer.

In one embodiment, the first polymer is a poly(fluorostyrene) having 1 to 5 fluorine substituents on the styrenic moiety, a poly(fluoro-hydroxy styrene), where the styrenic moiety can have 1 to 4 hydroxyl substituents and 1 to 4 fluorine substituents and where the location of the hydroxyl substituents and the fluorine substituents are independent of each other, a poly(tetrafluoro-para-hydroxy styrene), or a copolymer thereof. In an exemplary embodiment, the first polymer is a poly(tetrafluoro-para-hydroxy styrene). Exemplary first polymers are a poly(fluorostyrene), a poly(tetrafluoro-hydroxy styrene), or a combination comprising at least one of the foregoing first polymers.

In one embodiment, it is desirable for the first polymer (e.g., the poly(fluorostyrene)) to have a water contact angle of 70 to 90 degrees. In an exemplary embodiment, it is desirable for the first polymer to have a preferred water contact angle of 85 to 90 degrees.

The first polymer generally has a number of repeat units of 5 to 20, preferably 7 to 16, and more specifically 8 to 14. In one embodiment, the first polymer has a number average molecular weight of 1350 to 6000 Daltons when measured using gel permeation chromatography (GPC). The first polymer has a PDI of 1.05 to 1.20, specifically 1.08 to 1.12 as determined by GPC.

In an exemplary embodiment, the first block polymer of the graft block copolymer comprises a polynorbornene backbone polymer to which is grafted the first polymer that comprises a poly(tetrafluoro-para-hydroxy styrene) and has the structure in the formula (1) below:

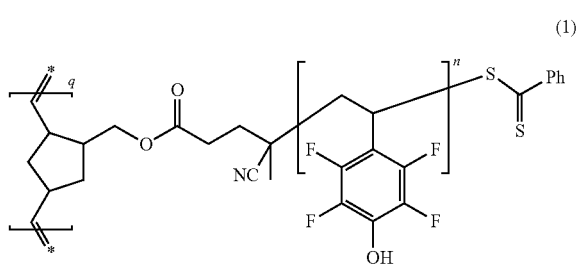
(1)

where n is 5 to 20 and q is 3 to 75.

As detailed above, the graft block copolymer can also comprise a second polymer that is grafted onto the backbone polymer in addition to the first polymer. The first polymer is the homopolymer detailed above, while the second polymer is a copolymer. In one embodiment, the second polymer does not contain a surface energy reducing moiety that comprises silicon, fluorine, or a combination of silicon or fluorine. In another embodiment, the second polymer contains the surface energy reducing moiety that comprises silicon, fluorine, or a combination of silicon or fluorine, but has a different chemical structure from the first polymer. The second polymer may also contain a functional group that contains a functional group that facilitates crosslinking of the graft block copolymer.

In one embodiment, the second polymer is a poly(hydroxy styrene), a poly(N-phenyl maleimide), or a copolymer thereof. In another embodiment, the poly(hydroxy styrene) is a poly(para-hydroxy styrene). In an exemplary embodiment, the second polymer is a copolymer of poly(hydroxy styrene) and poly(N-phenyl maleimide) denoted by poly(para-hydroxy styrene-co-N-phenyl maleimide). When the second polymer is a copolymer of poly(hydroxy styrene) and poly(N-phenyl maleimide) denoted by poly(para-hydroxy styrene-co-N-phenyl maleimide), the poly(hydroxy styrene), the molar ratio of poly(N-phenyl maleimide) to poly(para-hydroxy styrene-co-N-phenyl maleimide) is 1:6 to 6:1, specifically 1:3 to 3:1, and more specifically 1:2 to 2:1. In an exemplary embodiment, the molar ratio of poly(N-phenyl maleimide) to poly(para-hydroxy styrene-co-N-phenyl maleimide) in the second polymer is 1:1.

In one embodiment, it is desirable for the second polymer (e.g., the copolymer of polyhydroxystyrene and poly(N-phenylene maleimide) and to have a contact angle of 15 to 80 degrees, when contacted with water. In an exemplary embodiment, it is desirable for the second polymer to have a preferred water contact angle of 45 to 65 degrees.

The second polymer generally has a number of repeat units of 6 to 95, preferably 12 to 30, and more preferably 14 to 28 when measured using gel permeation chromatography (GPC). In one embodiment, the second polymer has a number average molecular weight of 1850 to 6250 Daltons when measured using GPC. The second polymer has a PDI of 1.05 to 1.30, preferably 1.05 to 1.15 as determined by GPC.

In another exemplary embodiment, the second block graft comprises a polynorbornene backbone to which is grafted the second polymer that comprises poly(para-hydroxy styrene-co-N-phenyl maleimide) and has the structure in the formula (2) below:

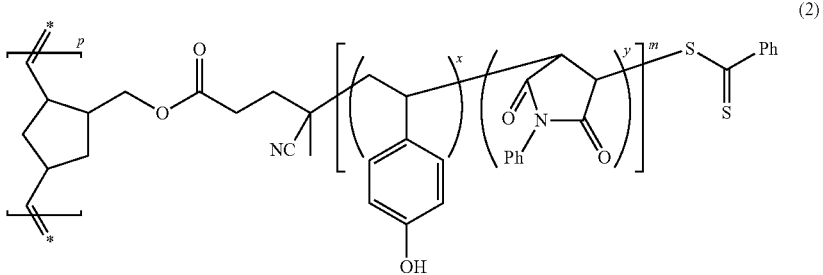
(2)

where m is 10 to 40, x is 0.25 to 1.5, y is 0.25 to 1.5 and p is 3 to 75.

The first block polymer is reacted with the second block polymer to produce the graft block copolymer having the structure of the formula (3) below:

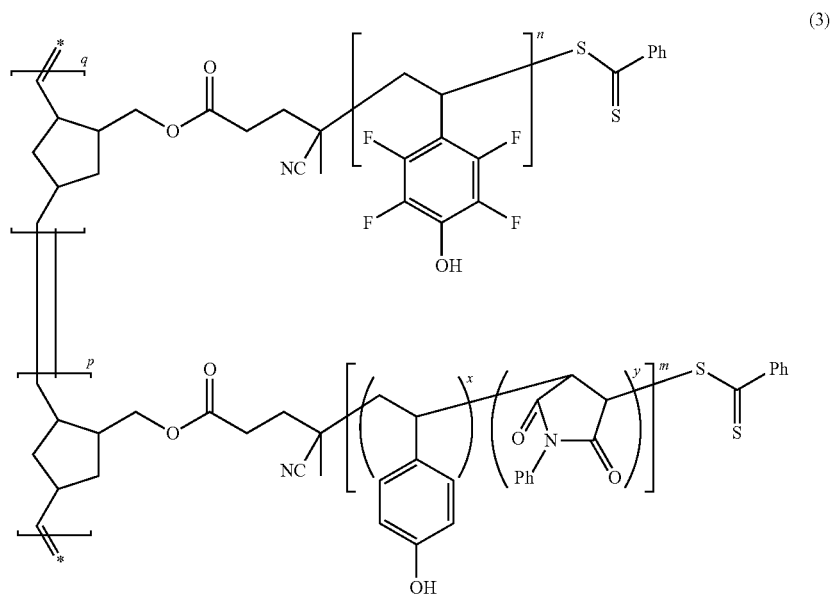

(3)

where m, n, p, q, x and y are specified above.

The copolymer can be manufactured in a batch process or in a continuous process. The batch process or the continuous process can involve a single or multiple reactors, single or multiple solvent and single or multiple catalysts (also termed initiators).

In one embodiment, in one method of producing the graft block copolymer, the first block polymer is synthesized separately from the second block polymer. The first block polymer is reactively bonded to the second block polymer to form the graft block copolymer.

The first block is manufactured by reacting a precursor to the backbone polymer with a chain transfer agent to form backbone polymer precursor-chain transfer agent moiety in a first reactor. The backbone polymer precursor-chain transfer agent moiety is then reacted with a precursor to the first polymer to form the first polymer using reversible addition-fragmentation chain transfer (RAFT) polymerization. The first polymer is covalently bonded to the precursor of the backbone polymer during the RAFT polymerization, which is conducted in the first reactor in the presence of a first solvent and a first initiator. The precursor to the backbone polymer is then polymerized via ring opening metathesis polymerization (ROMP) to form the first block polymer. The ROMP reaction may be conducted in the first reactor or in another reactor. The first block polymer comprises the backbone polymer with the first polymer grafted onto it. This first block polymer may be disposed upon a substrate to produce a self-assembled film without copolymerizing it to the second block. The film can then be crosslinked using radiation.

The second block polymer may be polymerized in a second reactor if desired. A precursor to the backbone polymer is reacted with a chain transfer agent to form a backbone polymer precursor-chain transfer agent moiety. The backbone polymer precursor-chain transfer agent moiety is then reacted with the precursor to the second polymer to form the second polymer using reversible addition-fragmentation chain transfer (RAFT) polymerization. The second polymer is covalently bonded to the first polymer precursor-chain transfer agent moiety during the RAFT polymerization, which is conducted in the presence of a second solvent and a second initiator. Since the second polymer is a copolymer, there are two or more precursors that are reacted together with the precursor to the backbone polymer to form the second graft polymer. The precursor to the second polymer is then polymerized via a second ring opening metathesis polymerization (ROMP) to form the second block polymer. The second block polymer comprises the backbone polymer with the second polymer grafted onto it. In the production of the first and the second block polymers, the first reactor may be the same as the second reactor, the first solvent may be the same as the second solvent and the first initiator may be the same as the second initiator. In one embodiment, the first reactor may be different from the second reactor, the first solvent may be different from the second solvent and the first initiator may be different from the second initiator.

In one embodiment, the first block polymer is reacted with the second block polymer in a second ring opening metathesis polymerization to form the graft block copolymer. The second ring opening metathesis polymerization may be conducted in either the first reactor, the second reactor or in a third reactor. The graft block copolymer is then purified by a variety of different methods that are listed below. It may then be disposed upon a substrate to produce a higher degree of self-assembly than the self-assembly produced by disposing either the first block polymer or the second block polymer by themselves on the substrate.

In an exemplary embodiment, when the backbone polymer is polynorbornene, when the first polymer is poly(tetrafluoro-para-hydroxy styrene) and when the second polymer is poly (para-hydroxy styrene-co-N-phenyl maleimide), the reaction to produce the graft block copolymer is as follows.

The first polymer is produced by reacting the norbornene with a dithioester chain transfer agent to produce a norbornene-chain transfer agent moiety. The norbornene-chain transfer agent moiety is then reacted with tetrafluoro-para-hydroxy styrene (TFpHS) monomer in a RAFT reaction to homopolymerize the tetrafluoro-para-hydroxy styrene to form the norborne-poly(tetrafluoro-para-hydroxy styrene) homopolymer (i.e., the first polymer). The reaction is demonstrated in reaction (1) below.

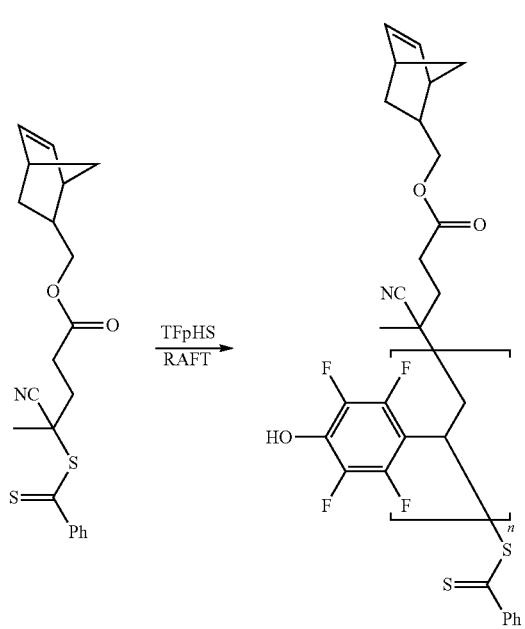

(1)

In the reaction (1) above, the molar ratio of the norbornene to the chain transfer agent is 0.5:1 to 1:0.5, preferably 0.75:1 to 1:0.75 and more preferably 0.9:1 to 1:0.9. In an exemplary embodiment, the molar ratio of the norbornene to the chain transfer agent is 1:1.

The molar ratio of the norbornene-chain transfer agent to the tetrafluoro-para-hydroxy styrene (TFpHS) monomer is 1:10 to 1:100, preferably 1:15 to 1:50 and more preferably 1:20 to 1:30. In an exemplary embodiment, the molar ratio of the norbornene-chain transfer agent to the tetrafluoro-para-hydroxy styrene (TFpHS) is 1:30.

The reaction (1) above may be conducted in a first solvent. Suitable solvents for conducting the reaction are polar solvents, non-polar solvents, or combinations thereof. Examples of solvents are aprotic polar solvents, polar protic solvents, or non-polar solvents. In one embodiments, aprotic polar solvents such as propylene carbonate, ethylene carbonate, butyrolactone, acetonitrile, benzonitrile, nitromethane, nitrobenzene, sulfolane, dimethylformamide, N-methylpyrrolidone, 2-butanone, acetone, hexanone, acetylacetone, benzophenone, acetophenone, or the like, or combinations comprising at least one of the foregoing solvents may be used. In another embodiment, polar protic solvents such as water, methanol, acetonitrile, nitromethane, ethanol, propanol, isopropanol, butanol, or the like, or combinations comprising at least one of the foregoing polar protic solvents may also be used. Other non-polar solvents such a benzene, alkylbenzenes (such as toluene or xylene), methylene chloride, carbon tetrachloride, hexane, diethyl ether, tetrahydrofuran, 1,4-dioxane, or the like, or combinations comprising at least one of the foregoing solvents may also be used. Co-solvents comprising at least one aprotic polar solvent and at least one non-polar solvent may also be utilized to modify the swelling power of the solvent and thereby adjust the rate of reaction. In an exemplary embodiment, the first solvent is 2-butanone. It is desirable to use anhydrous solvent for conducting the reaction.

The weight ratio of the solvent to the TFpHS is about 1:1 to about 5:1, specifically about 1.5:1 to about 3:1, and more specifically about 1.6:1 to about 2:1.

A first initiator may be used to initiate the first RAFT reaction. Examples of suitable initiators are azobisisobutyronitrile (AIBN), 4,4'-azobis(4-cyanovaleric acid) (ACVA), also called 4,4'-azobis(4-cyanopentanoic acid), di-tert-butyl peroxide (tBuOOtBu), benzoyl peroxide ((PhCOO)$_2$), methyl ethyl ketone peroxide, tert-amyl peroxybenzoate, dicetyl peroxydicarbonate, or the like or a combination comprising at least one of the foregoing initiators. The first initiator may also be a radical photoinitiator. Examples are benzoyl peroxide, benzoin ethers, benzoin ketals, hydroxyacetophenone, methylbenzoyl formate, anthroquinone, triarylsulfonium hexafluorophosphate salts, triarylsulfonium hexafluoroantimonate salts, phosphine oxide compounds such as Irgacure 2100 and 2022 (sold by BASF), or the like, or a combination comprising at least one of the foregoing radical initiators.

The initiator is used in molar ratio of 0.05 to 0.2 with respect to the norbornene-chain transfer agent. In an exemplary embodiment, the initiator is used in molar ratio of 0.07 to 0.18 with respect to the norbornene-chain transfer agent.

The first RAFT reaction between the norbornene-chain transfer agent and the tetrafluoro-para-hydroxy styrene to form the first polymer is conducted in the first reactor under agitation and at a temperature of 50 to 80° C., preferably 60 to 70° C. In an exemplary embodiment, the first RAFT reaction is conducted at a temperature of 65° C. The first polymer may be purified after its preparation by precipitation, washing, distillation, decanting, centrifugation, or the like. In an exemplary embodiment, the first polymer is purified by precipitation in hexane.

The second polymer is produced by reacting the norbornene with a dithioester chain transfer agent to produce a norbornene-chain transfer agent moiety. The norbornene-chain transfer agent moiety is then reacted with para-hydroxy styrene (pHS) and N-phenyl maleimide (PhMI) in a second reactor to produce the second polymer. The reaction is demonstrated in reaction (2) below.

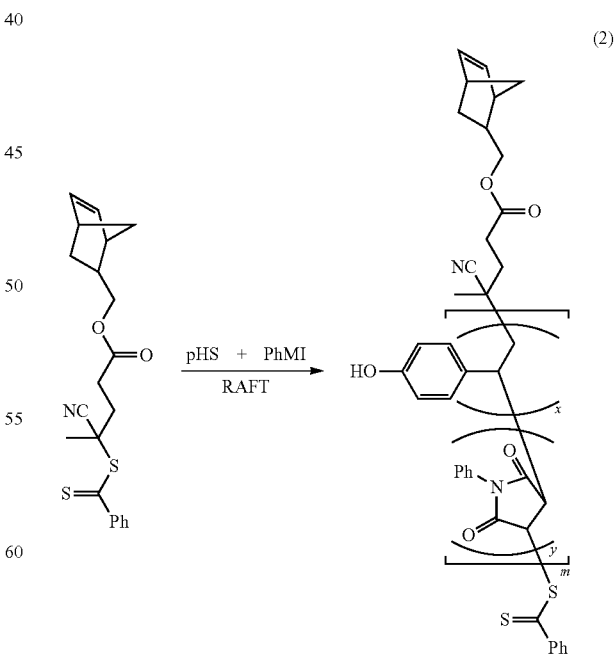

(2)

In the reaction (2) above, the molar ratio of the norbornene to the chain transfer agent is 0.5:1 to 1:0.5, preferably 0.75:1 to 1:0.75 and more preferably 0.9:1 to 1:0.9. In an exemplary embodiment, the molar ratio of the norbornene to the chain transfer agent is 1:1.

The molar ratio of para-hydroxy styrene to N-phenyl maleimide is 0.5:1 to 1:0.5, preferably 0.75:1 to 1:0.75 and more preferably 0.9:1 to 1:0.9. In an exemplary embodiment, the molar ratio of the para-hydroxy styrene to N-phenyl maleimide is 1:1.

The molar ratio of the norbornene-chain transfer agent to the para-hydroxy styrene and N-phenyl maleimide is 1:10 to 1:100, preferably 1:15 to 1:50 and more preferably 1:2 to 1:40. In an exemplary embodiment, the molar ratio of the norbornene-chain transfer agent to the monomer of para-hydroxy styrene and N-phenyl maleimide is 1:1.

The reaction (2) above may be conducted in a second solvent. The solvent may be chosen from the list of solvents mentioned above. The weight ratio of the solvent to the monomers is about 1:1 to about 10:1, specifically about 2:1 to about 6:1, and more specifically about 3:1 to about 4:1. In an exemplary embodiment, the second solvent is anhydrous 1,4-dioxane. An initiator may be used to initiate the second RAFT reaction. The initiators disclosed above may be used for the second RAFT reaction.

The initiator (for the preparation of the second polymer) is used in molar ratio of 0.05 to 0.2 with respect to the norbornene-chain transfer agent. In an exemplary embodiment, the initiator is used in molar ratio of 0.06 to 0.15 with respect to the norbornene-chain transfer agent.

The second RAFT reaction between the norbornene-chain transfer agent and the copolymer of para-hydroxy styrene and N-phenyl maleimide to form the second polymer is conducted in the first reactor under agitation and at a temperature of 50 to 80° C., preferably 55 to 75° C., and more preferably 60 to 65° C. In an exemplary embodiment, the second RAFT reaction is conducted at a temperature of 65° C. The second polymer may be purified after its preparation by precipitation, washing, distillation, decanting, centrifugation, or the like. In an exemplary embodiment, the second polymer is purified by precipitation in diethyl ether.

The first polymer prepared via the reaction (1) and the second polymer prepared via the reaction (2) are then subjected to the ring opening metathesis polymerization reaction (3) to convert the norbornene to polynorbornene and form the graft block copolymer. The reaction may be conducted in the first reactor, the second reactor or in a third reactor that is independent from the first two reactors. The reactors should be cleaned out prior to the reaction. The reaction is conducted in the presence of a modified Grubbs catalyst. The Grubbs catalyst may be a first generation Grubbs catalyst, a second generation Grubbs catalyst, a Hoveyda-Grubbs catalyst, or the like, or a combination comprising at least one of the foregoing Grubbs catalyst. The Grubbs catalyst may be a fast initiating catalyst if desired.

An exemplary modified Grubbs catalyst is shown in formula (4).

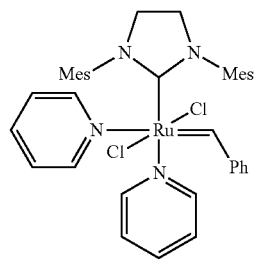

(4)

where Mes represents mesitylene or 1,3,5-trimethylbenzene.

The molar ratio of the Grubbs catalyst to the first polymer is 1:1 to 1:10. In an exemplary embodiment, the molar ratio of the Grubbs catalyst to the first polymer is 1:4. The molar ratio of the Grubbs catalyst to the second polymer is 1:1 to 1:100. In an exemplary embodiment, the molar ratio of the Grubbs catalyst to the second polymer is 1:30.

In the reaction (3), the molar ratio of the first polymer to the second polymer is 1:2 to 1:20. In an exemplary embodiment, in the reaction (3), the molar ratio of the first polymer to the second polymer is 1:7.

In one embodiment, in one method of preparing the graft block copolymer, the catalyst is first added to the reactor with a solvent and the mixture is agitated to obtain a homogenous solution. The first polymer and the second polymer are then sequentially added to the reactor. The reactor is agitated for a period of 1 to 5 hours. The polymerization was then quenched with a quencher. The graft block copolymer is then purified.

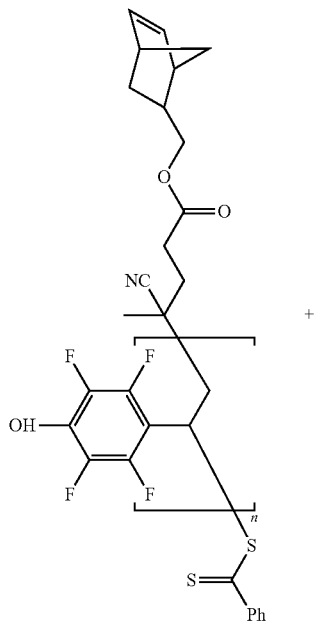

(3)

-continued

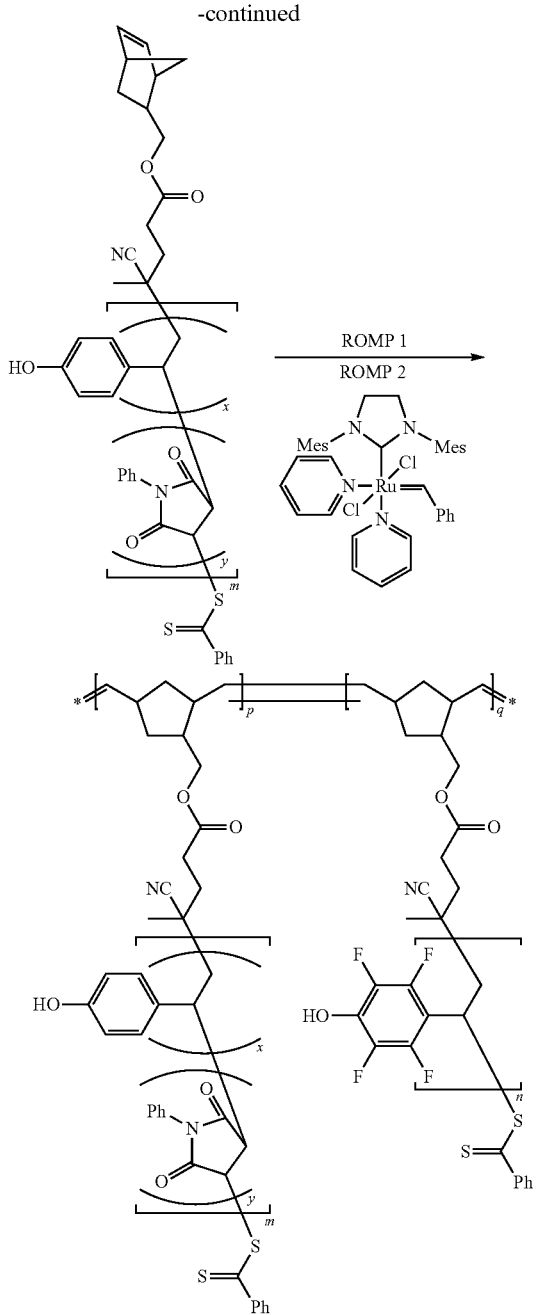

As detailed above, the first polymer and/or the second polymer comprise functional groups that are used for crosslinking the graft block copolymer. In one embodiment, any aromatic group having an R—OH or an R—SH functional group may be used for crosslinking the graft block copolymer. The functional group can be selected from the group consisting of a phenol, a hydroxyl aromatic, a hydroxyl heteroaromatic, an aryl thiol, a hydroxyl alkyl, a primary hydroxyl alkyl, a secondary hydroxyl alkyl, a tertiary hydroxyl alkyl, an alkyl thiol, a hydroxyl alkene, a melamine, a glycoluril, a benzoguanamine, an epoxy, a urea, or combinations thereof. An exemplary functional group is an alkyl alcohol, such as hydroxylethyl, or an aryl alcohol, such as phenol. In an exemplary embodiment, the second polymer comprises the functional group that can be used for crosslinking the graft block copolymer.

As noted above, the first polymer, the second polymer and the graft block copolymer may be purified by a variety of methods. Purification of the respective polymers is optional. The reactants, the respective polymers, and the graft block copolymer may be purified prior to and/or after the reaction. Purification may include washing, filtration, precipitation, decantation, centrifugation, distillation, or the like, or a combination comprising at least one of the foregoing methods of purification.

In one exemplary embodiment, all reactants including the solvents, initiators, endcapping agents and quenchers are purified prior to the reaction. It is generally desirable to use reactants, solvents and initiators that are purified to an amount of greater than or equal to about 90.0 wt % purity, specifically greater than or equal to about 95.0 wt % purity and more specifically greater than about or equal to about 99.0 wt % purity. In another exemplary embodiment, after polymerization of the graft block copolymer, it may be subjected to purification by methods that include washing, filtration, precipitation, decantation, centrifugation or distillation. Purification to remove substantially all metallic impurities and metallic catalyst impurities may also be conducted. The reduction of impurities reduces ordering defects when the graft block copolymer is annealed, and reduces defects in integrated circuits used in electronic devices.

In one embodiment, the copolymer may contain anti-oxidants, anti-ozonants, mold release agents, thermal stabilizers, levelers, viscosity modifying agents, free-radical quenching agents, crosslinking agents, photo acid generators, dyes, bleachable dyes, photosensitizers, metal oxide nanoparticles, conductive fillers, non-conductive fillers, thermally conductive fillers, other polymers or copolymers such as impact modifiers, or the like.

The graft block copolymer after purification may be used to manufacture a photoresist composition. The photoresist composition comprises the graft block copolymer, a solvent, a crosslinking agent, and a photoacid generator. In one embodiment, the graft block copolymer may be dissolved in a solvent along with a photo acid generator and a crosslinking agent and then disposed upon the surface of a substrate to form a graft block copolymer film that displays order in one or more directions, preferably in two or more directions and more preferably in three or more directions. In one embodiment, these directions are mutually perpendicular to each other.

The graft block copolymer disposed upon the surface of the substrate undergoes self-assembly in the form of bottle-brushes on the surface of the substrate. In one embodiment, when the copolymer comprises only a single block (i.e., either the first block polymer or the second block polymer), the brushes may self-assemble in only two dimensions on the surface of the substrate, i.e., the backbone polymers may not be oriented with their backbones disposed perpendicular to the surface of the substrate.

When the copolymer comprises two blocks (i.e., it is a graft block copolymer) and when one block copolymer comprises the surface energy reducing moiety, the brushes self-assemble in such a manner so that the backbone polymer is oriented substantially perpendicular to the surface of the substrate, while the first and second polymers extend radially outwards from the backbone polymer. The first and second polymers are substantially parallel to the surface of the substrate, when the backbone polymer is disposed substantially perpendicular to the surface of the substrate. This morphology is termed the vertical oriented bottle-brush morphology.

In one embodiment, when a monolayer of the graft block copolymer is disposed on a substrate, the individual polymer chains align with their backbones disposed substantially perpendicular to the substrate and the graft polymers extend radially outwards from the backbone. When two or more monolayers are disposed on the substrate, the bottle-brushes of the second layer may be inter-digitated with the bottle brushes of the first monolayer.

In one embodiment, the presence of the fluorine atoms in the terpolymer promotes the self-assembly of the brushes in three directions. Since the fluorine atom reduces the surface energy of the terpolymer, it facilitates an orientation of the terpolymer with the first block (the block that contains the fluorine atoms) located at the farthest end of the copolymer from the substrate. The FIGS. 2A and 2B display a top view and a side view respectively of the terpolymer that contains a polymer backbone 202, with the first polymer 204 grafted onto the backbone. The FIG. 2A (which represents the top view) shows that the brushes self-assemble to display order in two mutually perpendicular directions (y and z, which are in the plane of the substrate), while the FIG. 2B (which represents the side view) shows order in the third direction (the x-direction, which is perpendicular to the plane of the substrate). In the FIGS. 2A and 2B, the backbone polymer 200 has grafted onto it both the first polymer 203 (which comprises the surface energy reducing moiety) and the second polymer 205 (which does not contain a surface energy reducing moiety) and the presence of the surface energy reducing moiety produces order in three mutually directions. The order is reflected by the periodicity of the structures shown in the FIGS. 2A and 2B. The periodicity of the structures could be in either planar ordered arrays such as square packed or hexagonal close packed (hcp) arrays, or the packing arrangement can have various degrees of packing disorder. Compression and extension of the first and second polymers allows for planar packing of the bottle brush structures to conform and adjust to the local enthalpic and entropic energetic requirements in the packed film state. When the terpolymer does not contain the surface energy reducing moiety (e.g., fluorine atoms), the self-assembly in the x-direction, which is perpendicular to the plane of the substrate, does not take place as completely, and thus a number of the terpolymers within the film often lie flat in the y and z direction.

The graft block copolymer may be disposed upon the substrate by a variety of methods such as spray painting, spin casting, dip coating, brush coating, application with a doctor blade, or the like.

In one embodiment, a photoresist composition comprising the graft block copolymer, a crosslinking agent, and a photo acid generator may first be mixed (blended) and applied to the substrate to form a self-assembled film. The film is then dried to remove solvents. The resultant film thickness can be measured by a variety of techniques including ellipsometry, AFM, and SEM. When the bottle brush terpolymers are substantially self-assemble in the x-direction, which is perpendicular to the plane of the substrate, and if the casting solution is sufficiently dilute and the spin speed is adjusted so that the substrate if coated with a monolayer of terpolymer chains, the film thickness will be approximately an the length of the terpolymer backbone. The film is subjected to radiation to crosslink the terpolymer. A portion of the film may be protected from the radiation with a mask and this portion will not undergo any significant crosslinking. The uncrosslinked portions of the film may then be removed using a solvent or by etching leaving behind a patterned film. The patterned film may be used as a photoresist after baking and further developing.

In one embodiment, a photoresist composition comprising the graft block copolymer, a crosslinking agent, and a photo-acid generator may first be applied to the substrate to form a self-assembled film. The film is then dried to remove solvents. The film is subjected to electron beam radiation to crosslink the terpolymers. A portion of the film may be free from irradiation by either not directing the electron beam over this portion of the film, or with a mask. This unirradiated portion will not undergo any significant crosslinking. The uncrosslinked portions of the film may then be removed using a solvent or by etching leaving behind a patterned film. The patterned film may be used as a photoresist after baking and further developing.

Photoacid generators (PAG) may include sulfonium salts. An exemplary photoacid generator is triphenylsulfonium hexafluoroantimonate and an exemplary crosslinking agent is N,N,N',N',N'',N''-hexakis(methoxymethyl)-1,3,5-triazine-2,4,6-triamine (HMMM). Other crosslinking agents are methylols, alkoxymethylene ethers, epoxies, novolacs, melamines, resorcinols, and the like, or a combination comprising at least one of the foregoing crosslinking agents.

In the photoresist composition, the copolymer is used in amounts of 50 to 80 wt %, the photoacid generator is used in amounts of 5 to 25 wt % and the crosslinking agent is used in amounts of 5 to 25 wt %, based on the total weight of the photoresist composition. The photoresist composition may contain solvents if desired.

In one embodiment, the graft block copolymer may be used to selectively interact, or pin, a domain of the block copolymer that is disposed upon the graft block copolymer to induce order and registration of the block copolymer morphology. The graft block copolymer has a topology that can induce alignment and registration of one or more of the domains of the block copolymer.

The graft block copolymer can be used as a template to decorate or manufacture other surfaces that may be used in fields such as electronics, semiconductors, and the like. The graft block copolymer has a number of significant advantages over other block copolymers that can self-assemble and that are used in the formation of photoresists. By using graft block copolymers where a high degree of control is exerted over the synthetic chemistry, large-areas of vertical alignment of the graft block copolymer are achieved in films having a thickness of less than 50 nanometers (nm), preferably less than 30 nm, without the need for supramolecular assembly processes as are required for other comparative forms of linear block copolymer lithography. The structural and morphological features of the graft block copolymers can be tuned in the lateral and longitudinal directions thus enabling the preparation of high-sensitivity photoresists. Furthermore, the structural and morphological features of the graft block copolymers can be tuned in the lateral and longitudinal directions to facilitate an enhanced anisotropic vertical diffusion of photoacid catalyst. These photoresists (each comprising only a few graft block copolymers) can be used for photolithography in conjunction with high energy electromagnetic radiation (e.g., X-ray, electron beam, neutron beam, ionic radiation, extreme ultraviolet (having photons with energies from 10 eV up to 124 eV), and the like) with line-width resolutions of less than or equal to about 30 nm. The high-sensitivity of the graft block copolymer photoresist further facilitates the generation of latent images without post-exposure baking, which provides a practical approach for controlling acid reaction-diffusion processes in photolithography. The graft block copolymer, the photoresist composition and the photoresists derived therefrom are detailed in the following non-limiting examples.

EXAMPLE

This example is conducted to demonstrate the preparation of the graft block copolymer. The first block comprises a polynorbornene backbone polymer to which is grafted the first polymer—a poly(tetrafluoro-para-hydroxy styrene). The second block comprises a polynorbornene backbone polymer to which is grafted the second polymer—a copolymer of poly(para hydroxy styrene) and poly(N-phenyl maleimide).

The materials used for the production of the graft block copolymer are as follows:

The modified Grubbs catalyst, 4-hydroxystyrene (pHS), 2,3,5,6-tetrafluoro-4-hydroxystyrene (TFpHS), and the norbornene-chain transfer agents (NB-CTA) were synthesized according to the literature reports provided in the following references:

1. Li, Z.; Ma, J.; Lee, N. S.; Wooley, K. L. *J. Am. Chem. Soc.* 2011, 133, 1228.

2. Amir, R. J.; Zhong, S.; Pochan, D. J.; Hawker, C. J., *J. Am. Chem. Soc.* 2009, 131, 13949.

3. Pitois, C.; Wiesmann, D.; Lindgren, M.; Hult, A. *Adv. Mater.* 2001, 13, 1483.

4. Li, A.; Ma, J.; Sun, G.; Li, Z.; Cho, S.; Clark, C.; Wooley, K. L. *J. Polym. Sci., Part A: Polym. Chem.* 2012, 50, 1681.

The N,N,N',N',N'',N''-hexakis(methoxymethyl)-1,3,5-triazine-2,4,6-triamine (HMMM) was purchased from TCI and used without further purification. The photoacid generators (PAGs)—triphenylsulfonium hexafluoroantimonate for photolithography, and triphenylsulfonium perfluoro-1-butanesulfonate for electron beam lithography (EBL), respectively, were provided by DOW Electronic Materials. Other chemicals were purchased from Aldrich, Acros, and VWR and were used without further purification unless otherwise noted. Prior to use, tetrahydrofuran (THF) was distilled over sodium and stored under $N_2$. Dichloromethane ($CH_2Cl_2$) was distilled over calcium hydride and stored under nitrogen.

The instruments used for the analysis of the precursors and the products are detailed as follows: $^1H$ and $^{13}C$ NMR spectra were recorded on a Varian 500 MHz spectrometer interfaced to a UNIX computer using Mercury software. Chemical shifts were referred to the solvent proton resonance. IR spectra were recorded on an IR Prestige 21 system (Shimadzu Corp.) and analyzed by using the IR solution software.

The polymer molecular weight and molecular weight distribution were determined by Gel Permeation Chromatography (GPC). The GPC was conducted on a Waters 1515 HPLC (Waters Chromatography, Inc.) equipped with a Waters 2414 differential refractometer, a PD2020 dual-angle (15° and 90°) light scattering detector (Precision Detectors, Inc.), and a three-column series (PL gel 5 micrometer (μm) Mixed C, 500 Angstroms (Å), and $10^4$ Å, 300×7.5 millimeters (mm) columns; Polymer Laboratories, Inc.). The system was equilibrated at 40° C. in THF, which served as the polymer solvent and eluent with a flow rate of 1.0 milliliters per minute (mL/min). Polymer solutions were prepared at a known concentration (3-5 milligrams per milliliter (mg/mL)) and an injection volume of 200 microliters (μL) was used. Data collection and analysis were performed with Precision Acquire software and Discovery 32 software (Precision Detectors, Inc.), respectively. Inter-detector delay volume and the light scattering detector calibration constant were determined by calibration using a nearly monodisperse polystyrene standard (Polymer Laboratories, $M_p$=90 kiloDaltons (kDa), $M_w/M_n$<1.04). The differential refractometer was calibrated with standard polystyrene reference material (SRM 706 NIST), of a known specific refractive index increment dn/dc (0.184 milliliters per gram (mL/g)). The dn/dc values of the analyzed polymers were then determined from the differential refractometer response.

The surface energy of the film was calculated using the Owens-Wendt-Rabel-Kaelble (OWRK) method after measuring the contact angle with an optical tensiometer (KSV Instruments, Attension Theta). The X-ray Photoelectron Spectroscopy (XPS) experiments were performed on a Kratos Axis Ultra XPS system with a monochromatic aluminum X-ray source (10 milliAmperes (mA), 12 kilovolts (kV)). The binding energy scale was calibrated to 285 electron volts (eV) for the main C1s (carbon 1s) peak.

The secondary ion mass spectrometry (SIMS) measurements were carried out with a custom-built SIMS instrument coupled to a time-of-flight (TOF) mass analyzer. The instrument used in these studies is equipped with a $C_{60}$ effusion source capable of producing $C_{60}^{+2}$ projectiles with total impact energy of 50 kiloelectron volts (keV). The SIMS analysis of the polymer samples was conducted in the superstatic regime, where less than 0.1% of the surface is impacted. This restriction ensured that each time the surface was impacted by a primary ion, an unperturbed area of the surface was sampled. The superstatic measurements were conducted in the event-by-event bombardment-detection mode, where a single primary ion impacted on the surface and the secondary ions were collected and analyzed prior to subsequent primary ions impacting the surface. All secondary ions detected in a single impact originated from a 10 nm radius on the surface.

Each polymer sample was measured three times at different locations on the sample by TOF-SIMS. Each measurement consisted of ~3×$10^6$ projectile impacts on an area ~100 μm in radius. Multiple measurements were performed to ensure sample consistency. A quantitative estimate of surface coverage of fluorine containing molecules was calculated for each sample by using the signals at m/z=19, corresponding to fluorine (F) anion, and m/z=191, corresponding to $C_8F_4H_3O$ anion.

The EBL was carried out by using JEOL JSM-6460 Scanning Electron Microscope (SEM) equipped with DEBEN laser stage. The system was operated at 30 kV accelerating voltage and 10 picoAmperes (pA) beam current with series of exposure dosage ranging from 200 to 600 μC/$cm^2$ (corresponding to 6 to 18 millijoules per square centimeters (mJ/$cm^2$)). A 5×5 μm pattern with features including varied line width, i.e., 10, 20, 30, 40, 50, 60, 70, 80, 90, and 100 nm, respectively, and fixed 500 nm space was designed and used to evaluate the lithographic behavior of polymer resists.

The Atomic Force Microscopy (AFM) imaging was performed on MFP-3D system (Asylum Research) in tapping mode using standard silicon tips (VISTAprobes, T190-25, resonance constant: 190 kilohertz (kHz), tip radius: ~10 nm, spring constant: 48 newtons per meter (N/m). The Field Emission Scanning Electron Microscope (FE-SEM) images were collected with JEOL JSM-7500F using an accelerating voltage of 7 kV.

Example 1

Synthesis of the first polymer—(NB-P(TFpHS)$_{12}$). This example was conducted to demonstrate the manufacturing of the first polymer. The nomenclature employed here is as follows: NB—norbornene with the chain transfer agent; TF—tetrafluoro; pHS—para-hydroxystyrene; P(TFpHS)$_{12}$—poly(tetrafluoro-para-hydroxystyrene) having 12 repeat units.

The first polymer was manufactured as follows. To a 25 mL Schlenk flask equipped with a magnetic stirring bar dried with flame under $N_2$ atmosphere, was added the norbornene-chain transfer agent (NB-CTA) (301 milligrams (mg), 0.782 millimoles (mmol)), tetrafluoro-para-hydroxy styrene (TF-pHS) (4.49 g, 23.4 mmol), azobisisonitrile (AIBN) (12.7 mg, 78.2 micromoles (μmol)), and 10.5 mL of 2-butanone. The mixture was stirred 10 minutes (min) at room temperature (RT) and degassed through five cycles of freeze-pump-thaw. After the last cycle, the reaction mixture was stirred 10 minutes at RT and immersed into a pre-heated oil bath at 65° C. to start the copolymerization. After 11 hours (h), the polymerization was quenched by cooling the reaction flask with liquid nitrogen ($N_2$). The copolymer was purified by precipitation into 300 milliliters (mL) of hexane twice. The pink oil was collected through centrifugation, washed with 300 mL of hexane, and kept under vacuum overnight for removing residual solvents. The yield was 1.4 grams (g) of product, which is a 60% yield based upon ~45% monomer conversion. $M_{n,\ GPC}$=2,750 Daltons (Da) (laser detector), PDI=1.07. $^1$H NMR (500 MHz, DMSO-$d_6$) δ 10.95-11.90 (m, phenol OHs), 7.42-7.84 (m, Ar Hs from RAFT functionality), 6.08 (s, NB CH=CH), 5.10-5.30 (br, backbone chain end CH), 3.90-4.10 (m, NB $CH_2OC(O)$), 1.02-3.45 (m, all $CH_2$s and CHs from TFpHS unit backbone and NB ring). $^{13}$C NMR (125 MHz, DMSO-$d_6$) δ 206.9, 172.2, 145.6, 144.3, 144.1, 138.7, 137.2, 136.5, 135.0, 133.8, 129.3, 127.0, 123.2, 108.4, 73.1, 68.4, 63.0, 45.0, 43.5, 42.4, 41.5, 40.5, 38.3, 37.9, 35.8, 34.6, 34.4, 33.2, 31.4, 31.1, 29.6, 29.4, 28.9. IR ($cm^{-1}$): 2610-3720, 1714, 1658, 1523, 1495, 1459, 1351, 1245, 1142, 1048, 947, 866. $T_g$=150° C.

Example 2

This example was conducted to demonstrate the manufacturing of another first polymer.

Synthesis of the first polymer—(NB-P(TFpHS)$_{10}$). The nomenclature employed here is as follows: NB—norbornene with the chain transfer agent; TF—tetrafluoro; pHS—para-hydroxystyrene; P(TFpHS)$_{10}$—poly(tetrafluoro-para-hydroxystyrene) having 10 repeat units.

The first polymer was manufactured as follows. To a 25 mL Schlenk flask equipped with a magnetic stirring bar dried with flame under $N_2$ atmosphere, was added NB-CTA (510 mg, 1.32 mmol), TFpHS (5.06 g, 26.4 mmol), AIBN (12.9 mg, 79.2 µmol), and 12 mL of 2-butanone. The mixture was stirred 10 minutes at room temperature and degassed through five cycles of freeze-pump-thaw. After the last cycle, the reaction mixture was stirred 10 minutes at rt and immersed into a pre-heated oil bath at 65° C. to start the copolymerization. After 11 h, the polymerization was quenched by cooling the reaction flask with liquid $N_2$. The copolymer was purified by precipitation into 300 mL of hexane twice. The pink oil was collected through centrifugation, washed with 300 mL of hexane, and kept under vacuum overnight for removing residual solvents. Yield 1.7 g of product, 61% yield based upon ~45% monomer conversion. $M_{n,\ GPC}$=2,450 Da (laser detector), PDI=1.08. The $^1$H NMR, $^{13}$C NMR and IR spectra were similar as that obtained from the first polymer. The glass transition temperature ($T_g$)=150° C.

Example 3

Synthesis of the second polymer—(NB-P(pHS$_{13}$-co-PhMI$_{13}$)). This example was conducted to demonstrate the manufacturing of the second polymer. The nomenclature employed here is as follows: NB—norbornene with the chain transfer agent; pHS—para-hydroxystyrene; PhMI—N-phenyl maleimide; P(pHS$_{13}$-co-PhMI$_{13}$)—poly(para-hydroxy styrene-co-N-phenyl maleimide) where the para-hydroxy styrene is polymerized having 13 repeat units and the N-phenyl maleimide is polymerized to the poly(para-hydroxy styrene) and has 13 repeat units too.

The second polymer was manufactured as follows. To a 100 mL Schlenk flask equipped with a magnetic stirring bar dried with flame under $N_2$ atmosphere, was added NB-CTA (635 mg, 1.65 mmol), pHS (3.95 g, 33.0 mmol), PhMI (5.76 g, 33.0 mmol), AIBN (26.7 mg, 165 µmol) and 35 mL of anhydrous 1,4-dioxane. The mixture was stirred 10 minutes at RT and degassed through four cycles of freeze-pump-thaw. After the last cycle, the reaction mixture was stirred 15 minutes at RT and immersed into a pre-heated oil bath at 65° C. to start the copolymerization. After 6.5 hours, the polymerization was quenched by cooling the reaction flask with liquid $N_2$. The copolymer was purified by precipitation into 600 mL of diethyl ether twice. The pink precipitate was collected through centrifugation, washed with 200 mL of diethyl ether and 200 mL of hexane, and kept under vacuum overnight for removing residual solvents. Yield 3.4 g of product, 60% yield based upon ~55% conversion for both monomers. $M_{n,\ GPC}$=3,520 Da (RI detector), $M_{n,\ GPC}$=6,870 Da (laser detector), PDI=1.20. $^1$H NMR (500 MHz, DMSO-$d_6$) δ 9.20-9.80 (br, phenol OHs), 6.20-7.92 (m, Ar Hs), 6.08 (br, NB CH=CH), 5.10-5.43 (br, backbone chain end CH), 3.90-4.13 (m, NB $CH_2OC(O)$), 0.76-3.22 (m, all $CH_2$s and CHs from pHS unit backbone and NB ring, all CHs from MI units). $^{13}$C NMR (125 MHz, DMSO-$d_6$) δ 204.9, 176.8, 171.8, 156.7, 154.9, 136.8, 136.2, 132.0, 129.7, 129.0, 128.8, 126.8, 115.5, 114.7, 68.0, 61.9, 51.6, 44.6, 43.2, 42.2, 41.1, 37.6, 34.8, 34.6, 34.4, 33.2, 31.4, 31.1, 29.6, 29.4, 28.9. IR ($cm^{-1}$): 3118-3700, 2790-3090, 1774, 1701, 1610, 1506, 1450, 1380, 1262, 1185, 845, 750. The glass transition temperature ($T_g$)=130° C.

Example 4

Synthesis of the second polymer—(NB-P(pHS$_8$-co-PhMI$_8$)). This example was also conducted to demonstrate the manufacturing of the second polymer. The nomenclature employed here is as follows: NB—norbornene with the chain transfer agent; pHS—para-hydroxystyrene; PhMI—N-phenyl maleimide; P(pHS$_8$-co-PhMI$_8$)—poly(para-hydroxy styrene-co-N-phenyl maleimide) where the para-hydroxy styrene is polymerized having 8 repeat units and the N-phenyl maleimide is polymerized to the poly(para-hydroxy styrene) and has 8 repeat units too.

The second polymer was manufactured as follows. To a 50 mL Schlenk flask equipped with a magnetic stirring bar dried with flame under $N_2$ atmosphere, was added NB-CTA (802 mg, 2.08 mmol), pHS (2.50 g, 20.8 mmol), PhMI (3.60 g, 20.8 mmol), AIBN (16.9 mg, 104 µmol) and 20 mL of anhydrous 1,4-dioxane. The mixture was stirred 10 minutes at RT and degassed through four cycles of freeze-pump-thaw. After the last cycle, the reaction mixture was stirred 15 minutes at RT and immersed into a pre-heated oil bath at 65° C. to start the copolymerization. After 4.5 hours, the polymerization was quenched by cooling the reaction flask with liquid $N_2$. The copolymer was purified by precipitation into 600 mL of diethyl ether twice. The pink precipitate was collected through centrifugation, washed with 400 mL of diethyl ether and 400 mL of hexane, and kept under vacuum overnight for removing residual solvents. Yield 2.8 g of product, 73% yield based upon ~60% conversion for both monomers. $M_{n,\ GPC}$=2,730 Da (RI detector), $M_{n,\ GPC}$=3,800 Da (laser detector), PDI=1.12. The $^1$H NMR, $^{13}$C NMR and IR spectra were similar to that measured in the Example 3. The glass transition temperature ($T_g$)=130° C.

Example 5

Synthesis of Brush I

This example was conducted to demonstrate the manufacturing of a brush (the graft block copolymer) having the structure ((PNB-g-PTFpHS$_{12}$)$_3$-b-(PNB-g-P(pHS$_{13}$-co-PhMI$_{13}$)$_{26}$). The nomenclature adopted here is as follows: PNB—polynorbornene, which is the backbone polymer; PTFpHS$_{12}$—poly(tetrafluoro-para-hydroxy styrene) having 12 repeat units; P(pHS$_{13}$-co-PhMI$_{13}$)—is the same as in Example 3. The ((PNB-g-PTFpHS$_{12}$)$_3$-b-(PNB-g-P(pHS$_{13}$-co-PhMI$_{13}$)$_{26}$) is therefore a copolymer comprising a first block having a polynorbornene backbone of 3 repeat units onto which is grafted the poly(tetrafluoro-para-hydroxy styrene) (the first polymer) having 12 repeat units and a second block having a polynorbornene backbone of 26 repeat units onto which is grafted the copolymer (the second polymer) comprising 13 repeat units of poly(parahydroxystyrene) and 13 repeat units of poly(N-phenyl maleimide).

To a 10 mL Schlenk flask equipped with a magnetic stirring bar dried with flame under N$_2$ atmosphere, was added the modified Grubbs catalyst (3.37 mg, 4.63 µmol) and 0.6 mL of anhydrous CH$_2$Cl$_2$. The reaction mixture was stirred 1 minute at RT to obtain a homogeneous solution and degassed through three cycles of freeze-pump-thaw. After the last cycle, the solution of Example 1 (51.0 mg, 18.5 µmol) in 0.2 mL of anhydrous THF (degassed through two cycles of freeze-pump-thaw) was quickly added with an airtight syringe. The reaction mixture was allowed to stir for 40 minutes at RT before adding the solution of Example 3 (584 mg, 139 µmol) in 4.3 mL of anhydrous THF/CH$_2$Cl$_2$ (v/v=3.8:0.5, degassed through two cycles of freeze-pump-thaw) with an airtight syringe. The reaction mixture was stirred for 4 hours at RT before quenching the polymerization by adding 0.6 mL of ethyl vinyl ether (EVE), and was further stirred for 1 hour at RT. The solution was diluted with 5 mL of THF and precipitated into 180 mL of MeOH. The precipitate was collected through centrifugation and re-dissolved into 20 mL of THF/acetone (v/v=1:1). The solution was then precipitated into 200 mL of diethyl ether. The precipitate was collected through centrifugation, washed with 200 mL of diethyl ether and 200 mL of hexane, and kept under vacuum overnight for removing residual solvents. Yield 270 mg of product, 48% yield based upon ~80% conversion for Example 1 and ~90% conversion for Example 3, respectively. M$_{n, GPC}$=189 kDa (laser detector), PDI=1.25. $^1$H NMR (500 MHz, DMSO-d$_6$) δ 10.95-11.90 (m, phenol OHs), 9.20-9.80 (br, phenol OHs), 7.42-7.84 (m, Ar Hs from RAFT functionality), 6.20-8.20 (br, Ar Hs), 4.98-5.56 (br, brush backbone CH=CH), 0.76-4.06 (m, CH$_2$s and CHs from pHS, TFpHS, and MI unit backbones and PNB backbone). $^{13}$C NMR (125 MHz, DMSO-d$_6$) δ 197.8, 177.3, 172.1, 165.0, 157.2, 132.4, 129.3, 127.3, 115.9, 51.7, 42.2, 34.8. IR (cm$^{-1}$): 3000-3690, 2770-2990, 1774, 1697, 1607, 1509, 1450, 1380, 1262, 1175, 1030, 886, 841, 750. The glass transition temperatures (T$_g$) were 130 and 150° C., respectively.

Example 6

Synthesis of Brush II

This example was also conducted to demonstrate the manufacturing of a brush having the structure ((PNB-g-PTFpHS$_{10}$)$_4$-b-(PNB-g-P(pHS$_8$-co-PhMI$_8$)$_{37}$). The nomenclature adopted here is as follows: PNB—polynorbornene, which is the backbone polymer; PTFpHS$_{10}$-poly(tetrafluoro-para-hydroxy styrene) having 10 repeat units; P(pHS$_8$-co-PhMI$_8$)—is the same as in Example 4. The ((PNB-g-PTFpHS$_{10}$)$_4$-b-(PNB-g-P(pHS$_8$-co-PhMI$_8$)$_{37}$) is therefore a copolymer comprising a first block having a polynorbornene backbone of 4 repeat units onto which is grafted the poly(tetrafluoro-para-hydroxy styrene) (the first polymer) having 10 repeat units and a second block having a polynorbornene backbone of 37 repeat units onto which is grafted the copolymer (the second polymer) comprising 8 repeat units of poly(parahydroxystyrene) and 8 repeat units of poly(N-phenyl maleimide).

The nomenclature adopted in this example is the same as that adopted in the Example 5. To a 10 mL Schlenk flask equipped with a magnetic stirring bar dried with flame under N$_2$ atmosphere, was added the modified Grubbs catalyst (5.25 mg, 7.21 µmol) and 0.45 mL of anhydrous CH$_2$Cl$_2$. The modified Grubbs catalyst is shown in the formula (4) above.

The reaction mixture was stirred for 1 minute at RT to obtain a homogeneous solution and degassed through three cycles of freeze-pump-thaw. After the last cycle, the solution of Example 2 (69.7 mg, 30.3 µmol) in 0.65 mL of anhydrous THF (degassed through three cycles of freeze-pump-thaw) was quickly added with an airtight syringe. The reaction mixture was allowed to stir for 40 minutes at RT before adding the solution of Example 4 (550 mg, 201 µmol) in 5.0 mL of anhydrous THF (degassed through three cycles of freeze-pump-thaw) with an airtight syringe. The reaction mixture was stirred for 3 hours at RT before quenching the polymerization by adding 0.5 mL of ethyl vinyl ether (EVE), and was further stirred for 1 hour at RT. The solution was precipitated into 90 mL of diethyl ether. The precipitate was collected through centrifugation and re-dissolved into 20 mL of acetone. The solution was then precipitated into 200 mL of diethyl ether. The precipitate was collected through centrifugation, washed with 200 mL of diethyl ether and 200 mL of hexane, and kept under vacuum overnight for removing residual solvents. Yield 550 mg of product, 94% yield based upon ~90% conversion for Example 2 and ~95% conversion for Example 4, respectively. M$_{n, GPC}$=152 kDa (laser detector), PDI=1.26. The $^1$H NMR, $^{13}$C NMR and IR spectra were similar as that for Example 5. The glass transition temperatures were 130 and 150° C., respectively.

Example 7

This example demonstrates the manufacturing of a control sample that does not contain a block that has a surface energy reducing moiety. The control sample has the formula ((PNB-g-P(pHS$_{13}$-co-PhMI$_{13}$)$_{24}$) and comprises a backbone that contains a backbone polymer of polynorbornene having 24 repeat units with a copolymer comprising 13 repeat units of poly(parahydroxystyrene) and 13 repeat units of poly(N-phenyl maleimide). The polymer forms a brush that does not display the same degree of self-assembly as the brush that contains the fluorine atom (the fluorine atom being an example of the surface energy reducing moiety).

The brush polymer was manufactured as follows. To a 10 mL Schlenk flask equipped with a magnetic stirring bar dried with flame under N$_2$ atmosphere, was added the modified Grubbs catalyst (1.04 mg, 1.43 µmol) and 0.3 mL of anhydrous CH$_2$Cl$_2$. The reaction mixture was stirred for 1 minute at RT to obtain a homogeneous solution and degassed through three cycles of freeze-pump-thaw. After the last cycle, the solution of Example 3 (120 mg, 28.6 µmol) in 0.9 mL of anhydrous THF (degassed through three cycles of freeze-pump-thaw) was quickly added with an airtight syringe. The reaction mixture was allowed to stir for 60 minutes at RT before quenching the polymerization by adding 0.3 mL of EVE, and was further stirred for 1 hour at RT. The solution was precipitated into 60 mL of diethyl ether. The precipitate was collected through centrifugation and re-dissolved into 5 mL of acetone. The solution was then precipitated into 90 mL of diethyl ether/hexane (v/v=2:1). The precipitate was collected through centrifugation, washed with 100 mL of hexane twice, and kept under vacuum overnight for removing residual solvents. Yield 95 mg of product, 83% yield based upon ~95% conversion for Example 3. $M_{n, GPC}$=165 kDa (laser detector), PDI=1.16. $^1$H NMR (500 MHz, DMSO-d$_6$) δ 9.20-9.80 (br, phenol OHs), 7.42-7.84 (m, Ar Hs from RAFT functionality), 6.20-8.20 (br, Ar Hs), 4.98-5.56 (br, brush backbone CH=CH), 0.76-4.06 (m, CH$_2$s and CHs from pHS, and MI unit backbones and PNB backbone). $^{13}$C NMR (125 MHz, DMSO-d$_6$) δ 197.6, 177.4, 172.0, 165.0, 157.2, 132.4, 129.3, 127.3, 115.9, 51.7, 42.2, 34.8. IR (cm$^{-1}$): 2880-3690, 1775, 1694, 1613, 1596, 1515, 1499, 1452, 1381, 1174, 841, 750, 689. The glass transition temperature ($T_g$): 130° C.

Example 8

This example was conducted to demonstrate the manufacturing of a polymer thin film from the brushes of Example 5 (brush I), 6 (brush II) or 7 (brush control). The solution of respective polymer in cyclohexanone (1.0 wt %) was prepared and passed through a PTFE syringe filter (220 nm pore size) before using. The solution was applied onto a UV-O$_3$ pre-treated silicon wafer (the amount of applied polymer solution should be sufficient to cover the whole wafer surface) and spin coated at 500 revolutions per minute (rpm) for 5 seconds (s), followed by spinning at 3,000 rpm for 30 seconds (200 rpm/s acceleration rate for each step) to afford respective thin films with thicknesses of 18 to 25 nm.

The polymer film-coated silicon wafer was kept in a desiccator filled with saturated acetone atmosphere under vacuum for 20 hours. After the annealing process, the excess solvent was removed by pumping under vacuum and the N$_2$ gas was slowly backfilled to open the desiccator.

Figure 3:
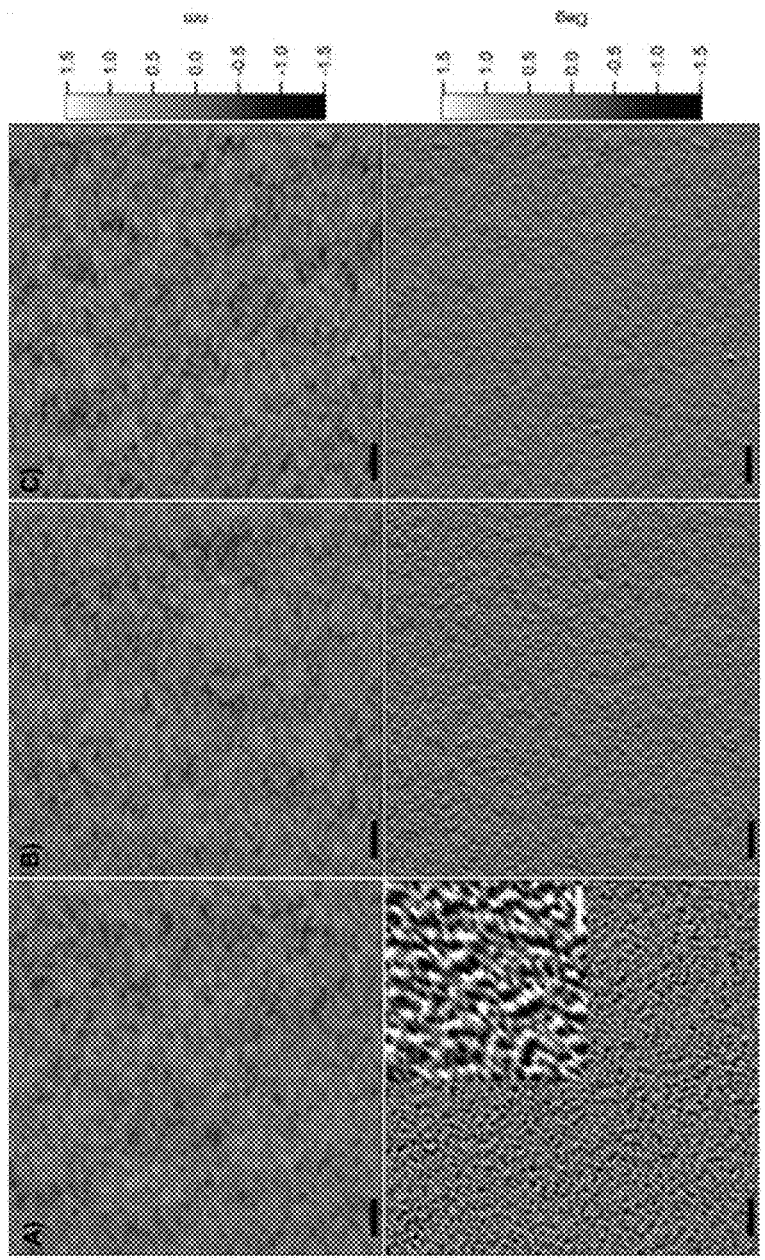
FIG. 3 is a photomicrograph showing atomic force microscopy (AFM) results where the upper images show tapping mode AFM and the lower images are phase images for (A) the brush control composition (B) brush I and (C) brush II.

The respective films were then characterized by tapping-mode atomic force microscopy (AFM). The 25 nm-thick film from the control sample (Example 7) showed noticeable phase segregation. The FIG. 3 depicts photomicrographs of these samples. The FIG. 3A show the brush control suggests the formation of cylindrical assemblies. However, these assemblies showed low degrees of order and relatively large sizes (>50 nm, estimated from the inserted imaging in the FIG. 3A).

By comparison, the films from brush I (Example 5) and II (Example 6) exhibited sufficiently homogeneous surface topology (FIGS. 3B and 3C, respectively) with root mean square (RMS) roughness less than 0.2 nm. The film thickness, as measured by AFM, was 18±2 nm and 22±2 nm for brush I and II, respectively, which showed agreement with the PNB backbone contour length of each brush precursor (17.4 and 24.6 nm for brush I and II, respectively). Therefore, the tunability of the radial dimension of molecular brush could provide a feasible approach for manipulating the film thickness and therefore a parameter for determining pattern features in direct writing lithographic processes.

The surface topographical homogeneities and the approximately monomolecular layer thicknesses of the brush films suggest that the brush polymer components within the films prefer to adopt perpendicular orientations to the wafer surface. Without being limited to theory, the vertical alignment can be attributed to the intrinsically cylindrical topology of brush polymers, which is induced by the strong size-exclusion effects between covalently-tethered dense polymer grafts. The fluorinated block segments in the unique graft block copolymers are believed to contribute effects to promote and assist in achieving vertical alignment, due to their preferential surface migration driven by their relatively lower surface energy.

Example 9

This example was conducted to demonstrate the manufacturing of a polymer thin film from compositions that contain the brushes of Example 5 (brush I), 6 (brush II) or 7 (brush control) and to demonstrate the crosslinking of the film as well as the preparing of a negative tone photoresist (by either exposing portions of the film to UV light or to an electron beam).

Triphenylsulfonium hexafluoroantimonate was used as photoacid generator (PAG) and N,N,N',N',N'',N''-hexakis(methoxymethyl)-1,3,5-triazine-2,4,6-triamine (HMMM) was selected as both multivalent cross-linker and acid quencher. The solution of polymer:HMMM:PAG was mixed in a weight ratio of 0.75:0.15:0.10 wt % in cyclohexanone was prepared and passed through a PTFE syringe filter (220 nm pore size) before casting the film as detailed in the Example 8. The solution was applied onto UV-O$_3$ pre-treated silicon wafer (the amount of applied solution should be sufficient to cover the whole wafer surface) and spin coated at 500 rpm for 5 seconds, followed by spinning at 3,000 rpm for 30 seconds (200 rpm/s acceleration rate for each step) to afford thin films with thicknesses of 25 to 28 nm.

The polymer resist film-coated wafer was exposed to the UV light source (254 nm, 6 W) via a quartz photomask at a distance of about 20 cm for 2 minutes. After exposure, the exposed film was post-baked on a 120° C. hotplate for 1 minute and then the unexposed area was developed by dipping the wafer into 0.26 M tetramethylammonium hydroxide (TMAH) aqueous solution for 30 seconds, followed by rinsing with DI water and drying with N$_2$ flow.

The films were alternatively exposed to electron beam "writing" with a predesigned pattern, the exposed wafer was post-baked on a 90° C. hotplate for 1 minute and dipped into 0.26 M TMAH$_{(aq)}$ solution for 1 minute. The wafers were rinsed with DI water and dried by N$_2$ flow.

The thin film was characterized by tapping-mode atomic force microscopy (AFM). The results are shown in the photomicrograph in the FIG. 3. The 25 nm-thick film from the brush control showed noticeable phase segregation (phase image in FIG. 3A), which suggested the formation of cylindrical assemblies. However, these assemblies showed low degrees of order and relatively large sizes (>50 nm, estimated from the inserted imaging in the FIG. 3A). By comparison, the films from brush I and II exhibited sufficiently homogeneous surface topography (FIGS. 3B and 3C respectively) with RMS roughness of less than 0.2 nm. The film thickness, as measured by AFM, was 18±2 nm and 22±2 nm for brush I and II respectively, which showed agreement with the polynorbornene backbone contour length of each brush precursor (17.4 and 24.6 nm for I and II respectively).

The surface topographical homogeneities and the approximately monomolecular layer thicknesses of the brush films suggest that the brush polymer components within the films preferred to adopt perpendicular orientations to the wafer surface. The vertical alignments could be attributed to the intrinsically cylindrical topology of brush polymers, which is induced by the strong size-exclusion effects between covalently-bonded polymers that are grafted onto the backbone polymers. Meanwhile, the fluorinated block segments in the graft block copolymers would contribute effects to promote and assist the vertical alignments, due to their preferential surface migration driven by their relatively lower surface energies.

Example 10

Figure 4:
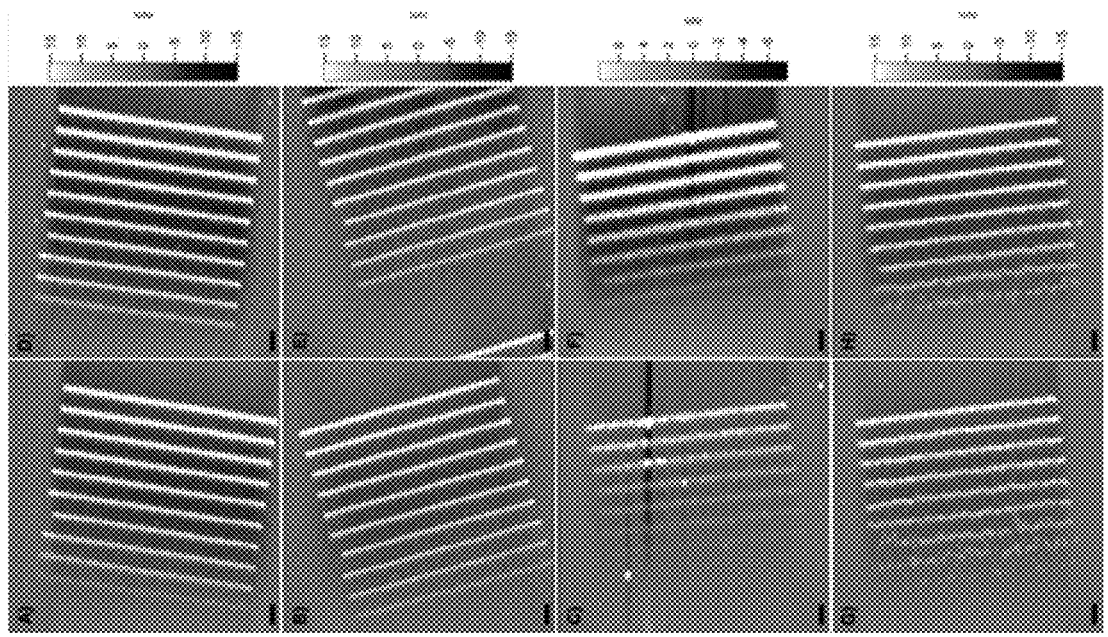
FIG. 4 shows tapping mode AFM images of patterns generated by 30 kV electron beam lithography (EBL).

This example was conducted to ascertain the performance of the graft block copolymer in a lithographic application as a chemically amplified resist. After exposure to the electromagnetic radiation described in the Example 9, the samples were subjected to post baking, which is detailed below. Triphenylsulfonium hexafluoroantimonate was used as photoacid generator (PAG) and N,N,N',N',N'',N''-hexakis(methoxymethyl)-1,3,5-triazine-2,4,6-triamine (HMMM) was selected as both multivalent cross-linker and acid quencher. Example 9 details the manufacturing of the resist. Atomic force micrograph (AFM) images of the respective brushes is shown in the FIG. 4.

From the AFM topographic images of the resulting patterns, brush I (FIG. 4A) displays a better lithographic performance than brush II (FIG. 4B), as evidenced by noticeably less line-edge roughness (LER) and less line-broadening effects. Cross-linked polymer residue was present within the pattern developed areas for brush II resists, which indicated that brush II CAR has a higher sensitivity than a brush I CAR. Although both brush-based CARs did not exhibit advantages over the brush control-based CAR (FIG. 4C) in the microscale 254 nm photolithographic survey, the electron beam lithography (EBL) of the brush resists revealed their significant superiorities over the brush control counterpart in the high-resolution nanoscopic pattern formation. Direct-EBL is an EBL process without post-exposure baking (PEB). This is the advantage of using bottle-brushes, i.e., it allows for the use of direct EBL.

The post-exposure baking EBL (PEB-EBL) studies of brush I, II and the brush control-based CARs (CAR-I, CAR-II, and CAR-LC, respectively) were carried out by applying the similar resist formulations as used for UV-photolithography (detailed above), while using the triphenylsulfonium perfluoro-1-butanesulfonate as PAG. A designed pattern with line width ranging from 10 to 100 nm features was used to evaluate their lithographic performances, through measuring the height and width of each resulting line at two exposure dosages (250 and 400 $\mu C/cm^2$, corresponding to a EUV (13.5 nm) dose of approximately 7.5 and 12 $mJ/cm^2$, respectively) by AFM. As shown in FIGS. 2A-2D, both CAR-I and CAR-II could create patterns with full line integrities at each exposure dosage. By comparison, the patterns from CAR-BC (brush control) only had rational features for the 50 to 100 nm designed lines (FIG. 2F), even at the relatively higher dosage (400 $\mu C/cm^2$). Furthermore, the parameters of the patterned lines in FIG. 2F were indeed not qualified for practical purpose (data not shown).

Figure 2:
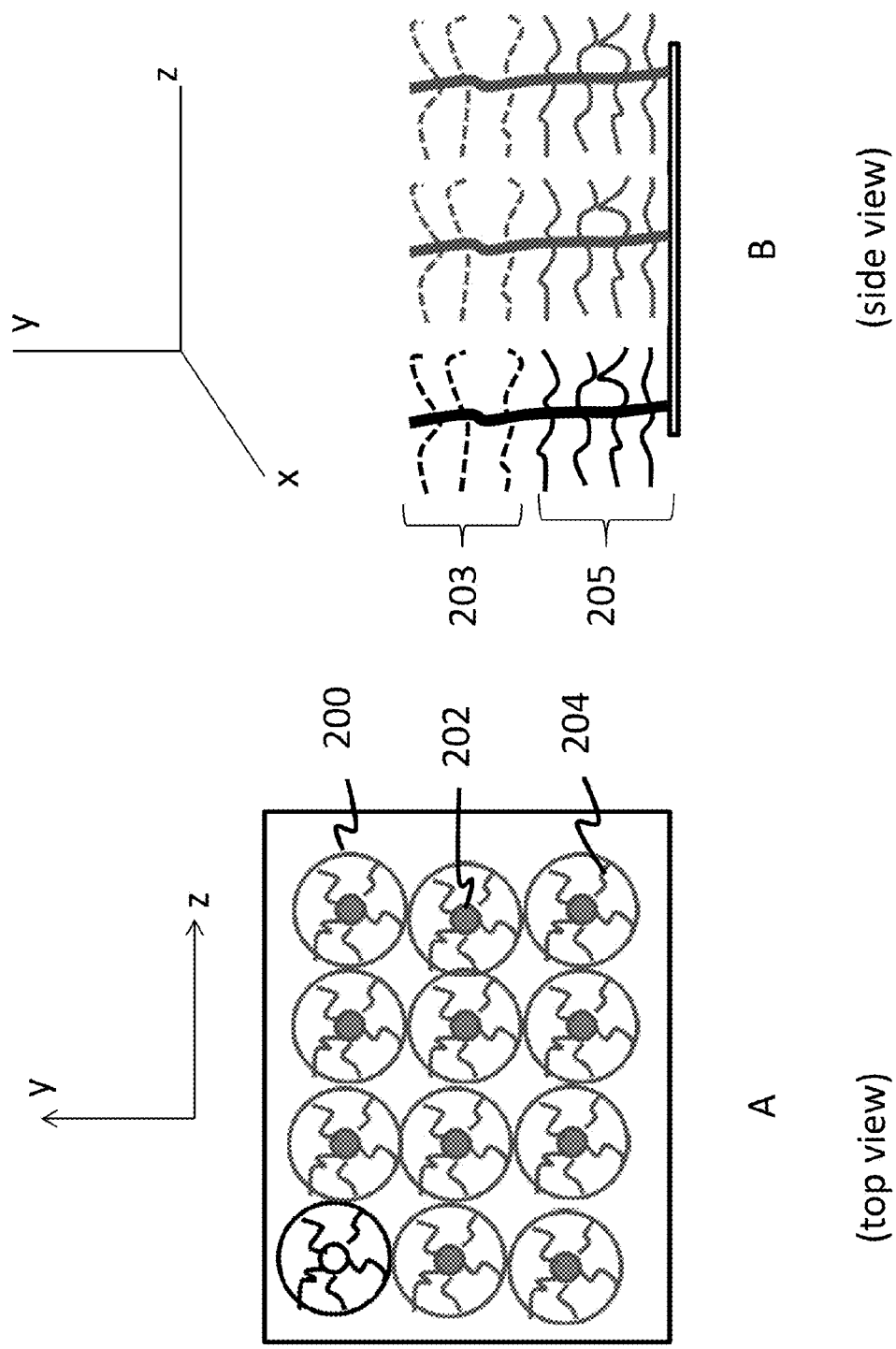
FIGS. 2A and 2B is a schematic depiction of an exemplary ordering that occurs when the brush polymer having a surface energy reducing moiety is disposed upon a substrate.

For the brush CARs in this study, the line features of the latent 30 nm to 100 nm lines were satisfactory, especially for the CAR-II after 400 $\mu C/cm^2$ exposure (FIG. 2E). We speculated that the better latent line-width features of CAR-II were induced by the intrinsic geometric factor of brush II. Although both I and II have cylindrical morphologies, the relatively shorter grafts in II render it a "thinner" column by reducing the chain entanglements after vertically aligning on the substrate surface. Currently, an about 30-nm isolated line was obtained for CAR-II under the aforementioned conditions. It can therefore be concluded that the brush molecular lengthwise and widthwise dimensional tuning, which can be easily achieved by the current "grafting-through" synthetic strategy, plays a critical role on the lithographic performance and eventually, that molecular pixels could be realized through further systematic optimizations of brush backbone and graft lengths, together with chemical compositions.

What is claimed is:

1. A composition comprising:
   a graft block copolymer comprising:
      a copolymer comprising:
         a backbone polymer; where the backbone polymer is a polyacetal, a polycarbonate, a polystyrene, a polyester, a polyamide, a polyamideimide, a polyarylate, a polyarylsulfone, a polyethersulfone, a polyphenylene sulfide, a polyvinyl chloride, a polysulfone, a polyimide, a polyetherimide, a polytetrafluoroethylene, a polyetherketone, a polyether etherketone, a polyether ketone ketone, a polybenzoxazole, a polyoxadiazole, a polybenzothiazinophenothiazine, a polybenzothiazole, a polypyrazinoquinoxaline, a polypyromellitimide, a polyquinoxaline, a polybenzimidazole, a polyoxindole, a polyoxoisoindoline, a polydioxoisoindoline, a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, a polyanhydride, a polyvinyl ether, a polyvinyl thioether, a polyvinyl alcohol, a polyvinyl ketone, a polyvinyl halide, a polyvinyl nitrile, a polyvinyl ester, a polysulfonate, a polynorbornene, a polysulfide, a polythioester, a polysulfonamide, a polyurea, a polyphosphazene, a polysilazane, a polyurethane, or a combination including at least one of the foregoing polymers; and
      a first graft polymer that comprises a surface energy reducing moiety; the first graft polymer being grafted onto the backbone polymer; where the surface energy reducing moiety comprises a fluorine atom, a silicon atom, or a combination of a fluorine atom and a silicon atom;
   a photoacid generator; and
   a crosslinking agent.

2. The composition of claim 1, where the backbone polymer is a polynorbornene.

3. The composition of claim 1, where the first polymer is a poly(tetrafluoro-para-hydroxy styrene).

4. The composition of claim 1, where the photoacid generator is triphenylsulfonium hexafluoroantimonate and where the crosslinking agent is N,N,N',N',N'',N''-hexakis(methoxymethyl)-1,3,5-triazine-2,4,6-triamine.

5. The composition of claim 1, where the copolymer is used in amounts of 50 to 80 wt %, the photoacid generator is used in amounts of 5 to 25 wt % and the crosslinking agent is used in amounts of 5 to 25 wt %, based on the total weight of the composition.

6. A method of manufacturing a photoresist comprising:
   mixing a composition comprising:
      a copolymer comprising:
         a backbone polymer; and
         a first graft polymer that comprises a surface energy reducing moiety; the first graft polymer being grafted onto the backbone polymer; where the surface energy reducing moiety comprises a fluorine atom, a silicon atom, or a combination of a fluorine atom and a silicon atom;
      a photoacid generator; and
      a crosslinking agent;
   disposing the composition on a substrate;

forming a film on the substrate;
disposing a mask on the film;
exposing the film to electromagnetic radiation to form a crosslinked film that comprises bottle-brushes;
baking the film; and
dissolving unreacted portions of the film.

7. The method of claim 6, where the electromagnetic radiation is extreme UV radiation, UV radiation, electron beam radiation and xray radiation.

8. The method of claim 6, further comprising using the film as a photoresist.

9. The method of claim 8, where the photoresist is a negative tone photoresist.

10. The method of claim 6, where the photoresist composition is subjected to annealing.

11. The method of claim 6, where the photoresist composition is dissolved in a solvent.

\* \* \* \* \*